US012793781B2

(12) United States Patent
Ogura et al.

(10) Patent No.: US 12,793,781 B2
(45) Date of Patent: Nov. 10, 2026

(54) SEMICONDUCTOR MEMORY DEVICE

(71) Applicant: Kioxia Corporation, Tokyo (JP)

(72) Inventors: Tatsuo Ogura, Yokkaichi Mie (JP); Masaki Kondo, Yokkaichi Mie (JP); Takashi Maeda, Kamakura Kanagawa (JP)

(73) Assignee: Kioxia Corporation, Tokyo (JP)

(*) Notice: Subject to any disclaimer, the term of this patent is extended or adjusted under 35 U.S.C. 154(b) by 73 days.

(21) Appl. No.: 18/829,434

(22) Filed: Sep. 10, 2024

(65) Prior Publication Data

US 2025/0095743 A1 Mar. 20, 2025

(30) Foreign Application Priority Data

Sep. 15, 2023 (JP) ................................ 2023-150553

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *G11C 16/26* (2013.01);
(Continued)

(58) Field of Classification Search
CPC ..... G11C 16/10; G11C 16/0483; G11C 16/26; G11C 16/3459; G11C 16/24;
(Continued)

(56) References Cited

U.S. PATENT DOCUMENTS

| | | | |
|---|---|---|---|
| 8,576,623 | B2 | 11/2013 | Nawata |
| 2020/0294600 | A1 | 9/2020 | Shibuya |

(Continued)

FOREIGN PATENT DOCUMENTS

| | | | |
|---|---|---|---|
| JP | 2012-190523 | A | 10/2012 |
| JP | 2020-149742 | A | 9/2020 |

OTHER PUBLICATIONS

Jiho Cho et al., "A 512Gb 3b/Cell 7th-Generation 3D-NAND Flash Memory with 184MB/s Write Throughput and 2.0Gb/s Interface", 201D, ISSCC 2021, Session 30, Non-Volatile Memories, 30.3.

*Primary Examiner* — Huan Hoang
(74) *Attorney, Agent, or Firm* — Foley & Lardner LLP

(57) ABSTRACT

A semiconductor memory device includes: a first conductive layer; and a second conductive layer adjacent to the first conductive layer. Write loops each include: a first program operation that applies the first conductive layer with a program voltage and applies a bit line with a first bit line voltage; and a second program operation that applies the first conductive layer with the program voltage and applies the bit line with a second bit line voltage larger than the first bit line voltage. The write operation includes a state judging operation that judges whether a memory cell corresponding to the semiconductor layer and the second conductive layer has been controlled to a Low-state, or not. When the memory cell has been controlled to the Low-state, the first program operation is executed, and when the memory cell has not been controlled to the Low-state, the second program operation is executed.

12 Claims, 31 Drawing Sheets

(51) Int. Cl.

| | |
|---|---|
| ***G11C 16/26*** | (2006.01) |
| ***G11C 16/34*** | (2006.01) |
| ***H10B 43/30*** | (2023.01) |
| ***H10B 43/40*** | (2023.01) |
| *G11C 16/24* | (2006.01) |
| *H10W 90/00* | (2026.01) |
| *H10W 90/24* | (2026.01) |

(52) U.S. Cl.
CPC ......... *G11C 16/3459* (2013.01); *H10B 43/30* (2023.02); *H10B 43/40* (2023.02); *G11C 16/24* (2013.01); *H10W 90/00* (2026.01); *H10W 90/24* (2026.01)

(58) Field of Classification Search
CPC ..... G11C 11/5628; G11C 16/08; H10B 43/30; H10B 43/40; H10B 43/27; H10W 90/00; H10W 90/24
USPC ........................................................ 365/185.2
See application file for complete search history.

(56) References Cited

U.S. PATENT DOCUMENTS

2020/0350022 A1 11/2020 Choo
2023/0307060 A1* 9/2023 Iga .......................... G11C 16/26

* cited by examiner 2-3-2 code

| | Er | A | B | C | D | E | F | G |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

FIG. 13

| | Er | A | B | C | D | E | F | G | |
|---|---|---|---|---|---|---|---|---|---|
| XDL | * | * | * | * | * | * | * | * | Cache Memory |
| ADL | 1 | 0 | 0 | 0 | 0 | 1 | 1 | 1 | Lower Page |
| BDL | 1 | 1 | 0 | 0 | 1 | 1 | 0 | 0 | Middle Page |
| CDL | 1 | 1 | 1 | 0 | 0 | 0 | 0 | 1 | Upper Page |
| TDL | 1 | 0/1 | 0/1 | 0/1 | 0/1 | 0/1 | 0/1 | 0 | QPW Data |
| SDL | | | | | | | | | S/A control |

SEMICONDUCTOR MEMORY DEVICE

CROSS-REFERENCE TO RELATED APPLICATIONS

This application is based upon and claims the benefit of Japanese Patent Application No. 2023-150553, filed on Sep. 15, 2023, the entire contents of which are incorporated herein by reference.

BACKGROUND

Field

The present embodiments relate to semiconductor memory devices.

Description of the Related Art

There is known a semiconductor memory device comprising: a substrate; a plurality of first conductive layers arranged in a first direction intersecting a surface of the substrate; and a semiconductor layer extending in the first direction and facing the plurality of first conductive layers.

BRIEF DESCRIPTION OF THE DRAWINGS

FIG. 13 is a view showing data stored in latch circuits XDL, ADL, BDL, CDL, TDL, SDL.

DETAILED DESCRIPTION

Figure 1:
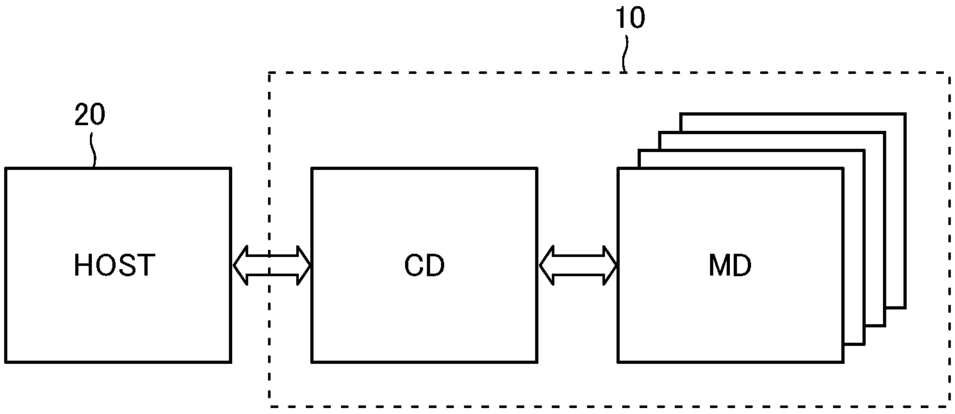
FIG. 1 is a schematic block diagram showing a configuration of a memory system 10 according to a first embodiment.

A semiconductor memory device according to one embodiment comprises: a substrate; a plurality of conductive layers arranged in a first direction intersecting a surface of the substrate; a semiconductor layer extending in the first direction and facing the plurality of conductive layers; an electric charge accumulating layer provided between the plurality of conductive layers and the semiconductor layer; a bit line electrically connected to one end portion in the first direction of the semiconductor layer; and a control circuit electrically connected to the plurality of conductive layers and the bit line. The plurality of conductive layers include: a first conductive layer; and a second conductive layer adjacent in the first direction to the first conductive layer. The control circuit is configured capable of executing a write operation, and the write operation includes a plurality of write loops. The plurality of write loops each include: a first program operation that applies the first conductive layer with a program voltage, applies the second conductive layer with a write pass voltage smaller than the program voltage, and applies the bit line with a first bit line voltage; and a second program operation that applies the first conductive layer with the program voltage, applies the second conductive layer with the write pass voltage, and applies the bit line with a second bit line voltage larger than the first bit line voltage. The program voltage increases an offset voltage at a time along with increase in the number of times of executions of the write loop. The write operation includes a state judging operation that judges whether a memory cell corresponding to the semiconductor layer and the second conductive layer is controlled to a Low-state, or not. When the memory cell is controlled to the Low-state, the first program operation is executed, and when the memory cell is not controlled to the Low-state, the second program operation is executed.

Next, semiconductor memory devices according to embodiments will be described in detail with reference to the drawings. Note that the following embodiments are merely examples, and are not shown with the intention of limiting the present invention. Moreover, the following drawings are schematic, and, for convenience of description, a part of configurations, and so on, thereof will sometimes be omitted. Moreover, portions that are common to a plurality of embodiments will be assigned with the same symbols, and descriptions thereof sometimes omitted.

Moreover, when a "semiconductor memory device" is referred to in the present specification, it will sometimes mean a memory die, and will sometimes mean a memory system including a controller die, of the likes of a memory chip, a memory card, or an SSD (Solid State Drive). Furthermore, it will sometimes mean a configuration including a host computer, of the likes of a smartphone, a tablet terminal, or a personal computer.

Moreover, when a "control circuit" is referred to in the present specification, it will sometimes mean a peripheral circuit of the likes of a sequencer provided in a memory die, will sometimes mean the likes of a controller die or controller chip connected to the memory die, and will sometimes mean a configuration including both the peripheral circuit and the controller die or controller chip.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, in the case of three transistors having been serially connected, the first transistor is still "electrically connected" to the third transistor even when the second transistor is in an OFF state.

Moreover, in the present specification, when a first configuration is said to be "connected between" a second configuration and a third configuration, it will sometimes mean that the first configuration, the second configuration, and the third configuration are serially connected, and the second configuration is connected to the third configuration via the first configuration.

Moreover, in the present specification, when a circuit, or the like, is said to "make electrically continuous" two wirings, or the like, this will sometimes mean, for example, that this circuit, or the like, includes a transistor, or the like, that this transistor, or the like, is provided in a current path between the two wirings, and that this transistor, or the like, is in an ON state.

Moreover, in the present specification, a certain direction parallel to an upper surface of a substrate will be referred to as an X-direction, a direction parallel to the upper surface of the substrate and perpendicular to the X-direction will be referred to as a Y-direction, and a direction perpendicular to the upper surface of the substrate will be referred to as a Z-direction.

Moreover, in the present specification, a direction lying along a certain plane will sometimes be referred to as a first direction, a direction intersecting the first direction along the certain plane will sometimes be referred to as a second direction, and a direction intersecting the certain plane will sometimes be referred to as a third direction. These first direction, second direction, and third direction may correspond to any of the X-direction, the Y-direction, and the Z-direction, but need not do so.

Moreover, in the present specification, expressions such as "above" or "below" will be defined with reference to the substrate. For example, an orientation of moving away from the substrate along the above-described Z-direction will be referred to as above, and an orientation of coming closer to the substrate along the Z-direction will be referred to as below. Moreover, when a lower surface or a lower end is referred to for a certain configuration, this will be assumed to mean a surface or end portion on a substrate side of this configuration, and when an upper surface or an upper end is referred to for a certain configuration, this will be assumed to mean a surface or end portion on an opposite side to the substrate of this configuration. Moreover, a surface intersecting the X-direction or the Y-direction will be referred to as a side surface, and so on.

First Embodiment

[Memory System 10]

FIG. 1 is a schematic block diagram showing a configuration of a memory system 10 according to a first embodiment.

The memory system 10 performs read, write, erase, and so on, of user data, in response to a signal transmitted from a host computer 20. The memory system 10 is a memory chip, a memory card, an SSD, or another system capable of storing user data, for example. The memory system 10 comprises: a plurality of memory dies MD storing user data; and a controller die CD connected to these plurality of memory dies MD and to the host computer 20. The controller die CD comprises the likes of a processor and a RAM, for example, and performs processing, such as conversion of a logical address and a physical address, bit error detection/correction, garbage collection (compaction), and wear leveling.

Figure 2:
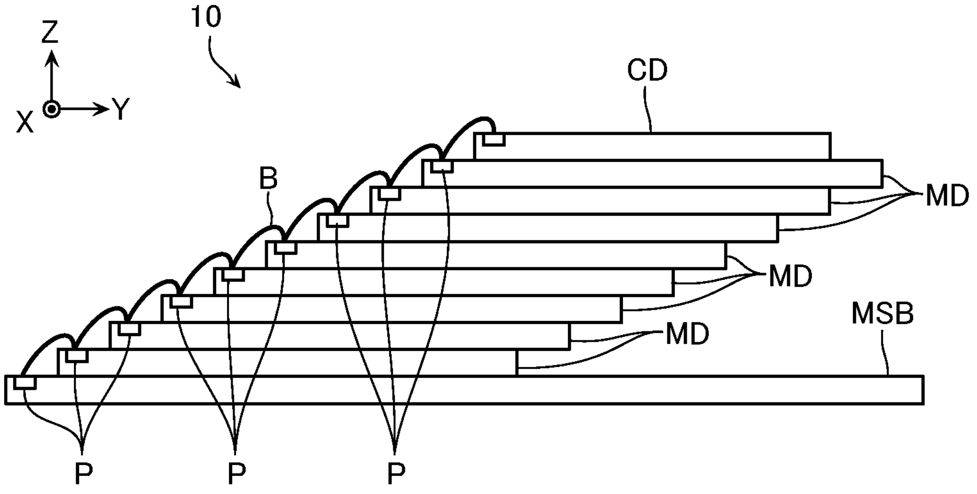
FIG. 2 is a schematic side view showing a configuration example of same memory system 10.
Figure 3:
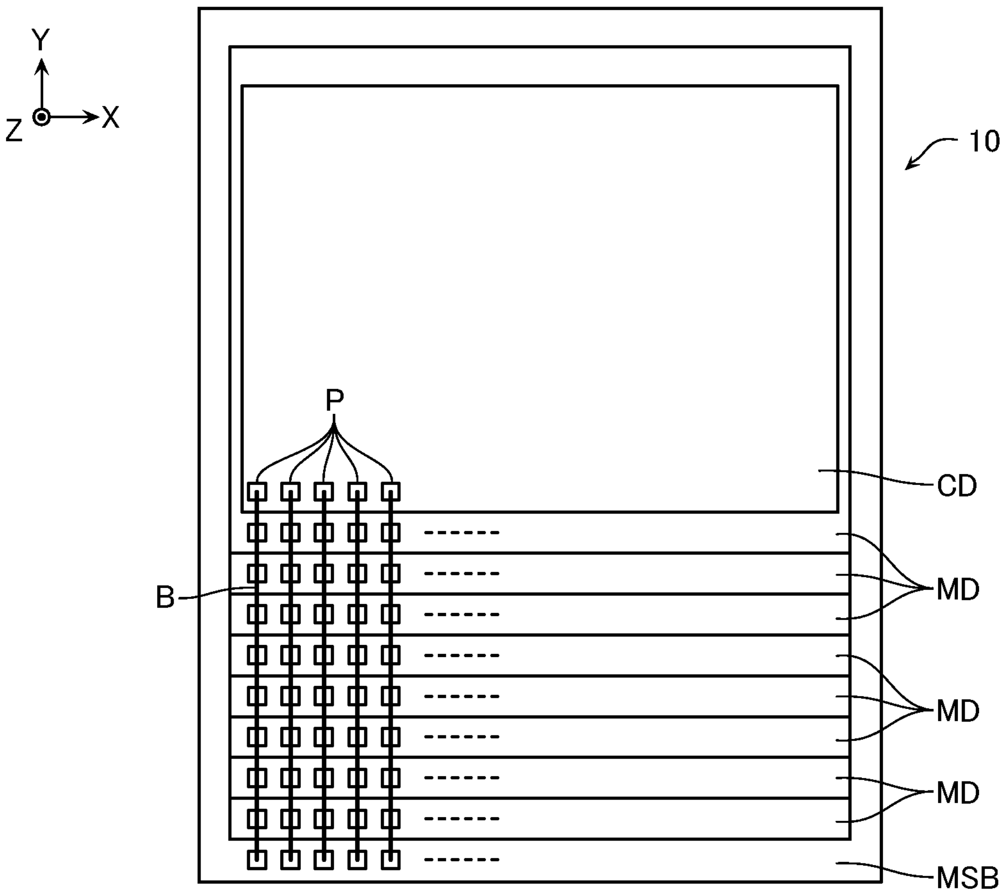
FIG. 3 is a schematic plan view showing same configuration example.

FIG. 2 is a schematic side view showing a configuration example of the memory system 10 according to the present embodiment. FIG. 3 is a schematic plan view showing same configuration example. For convenience of description, parts of the configurations are omitted in FIGS. 2 and 3.

As shown in FIG. 2, the memory system 10 according to the present embodiment comprises: a mounting substrate MSB; the plurality of memory dies MD stacked on the mounting substrate MSB; and the controller die CD stacked on the memory die MD. A region of an end portion in the Y-direction, of an upper surface of the mounting substrate MSB is provided with a pad electrode P, and a part of another region of the upper surface of the mounting substrate MSB is adhered to a lower surface of the memory die MD, via an adhesive agent, or the like. Regions of end portions in the Y-direction, of upper surfaces of the memory dies MD are provided with the pad electrodes P, and other regions of the upper surfaces of the memory dies MD are adhered to lower surfaces of other memory dies MD or a lower surface of the controller die CD, via an adhesive agent, or the like. A region of an end portion in the Y-direction, of an upper surface of the controller die CD is provided with the pad electrode P.

As shown in FIG. 3, the mounting substrate MSB, the plurality of memory dies MD, and the controller die CD each comprise a plurality of pad electrodes P arranged in the X-direction. The plurality of pad electrodes P provided on the mounting substrate MSB, plurality of memory dies MD, and controller die CD are respectively connected to each other via bonding wires B.

Note that the configuration shown in FIGS. 2 and 3 is merely an exemplification, and that a specific configuration is appropriately adjustable. For example, in the example shown in FIGS. 2 and 3, the controller die CD is stacked on the plurality of memory dies MD, and these configurations are connected by the bonding wires B. In such a configuration, the plurality of memory dies MD and the controller die CD are included in a single package. However, the controller die CD may be included in a separate package from the memory dies MD. Moreover, the plurality of memory dies MD and the controller die CD may be connected to each other via through-electrodes, or the like, not the bonding wires B.

[Circuit Configuration of Memory Die MD]

Figure 4:
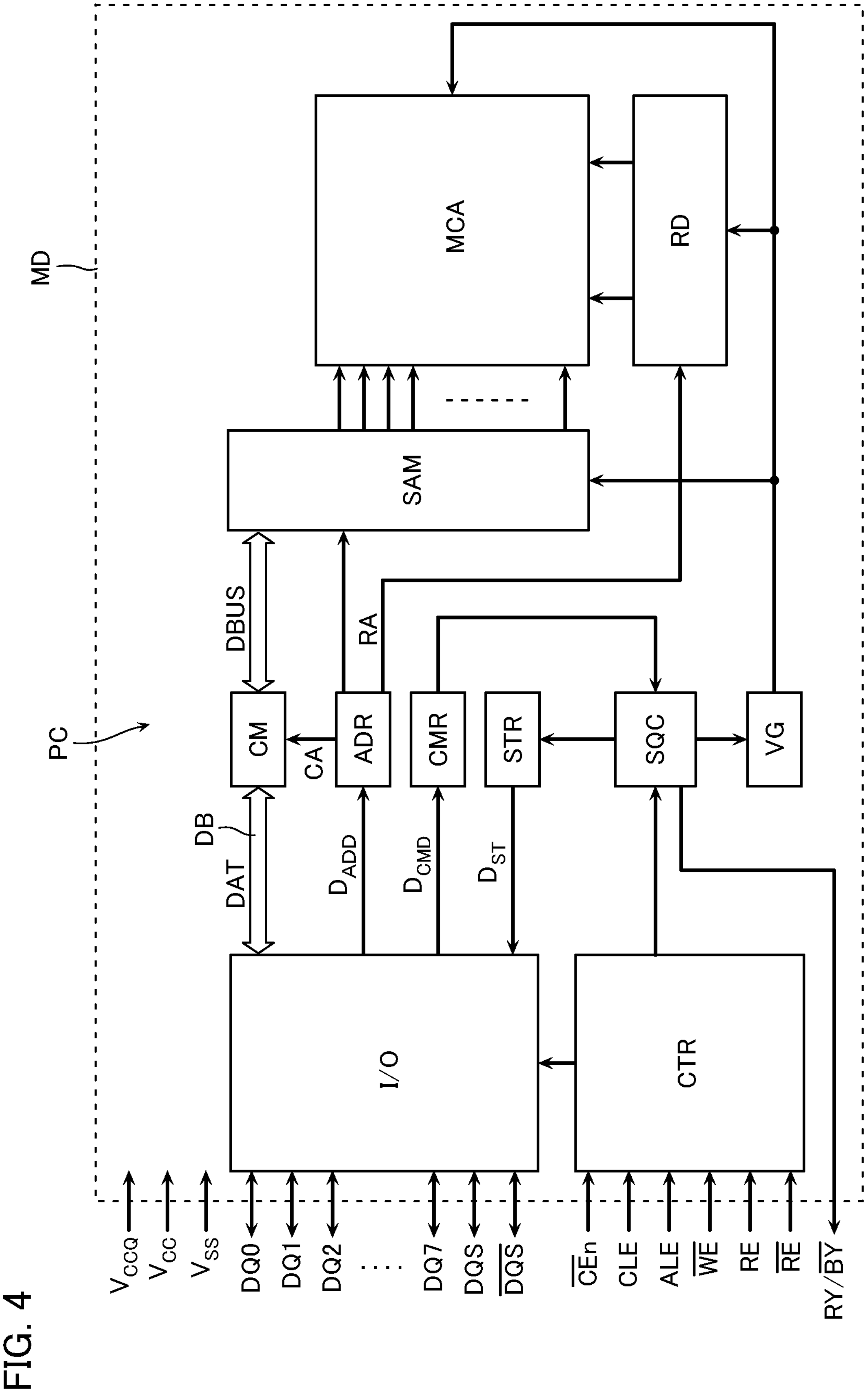
FIG. 4 is a schematic block diagram showing a configuration of a memory die MD according to the first embodiment.
Figure 5:
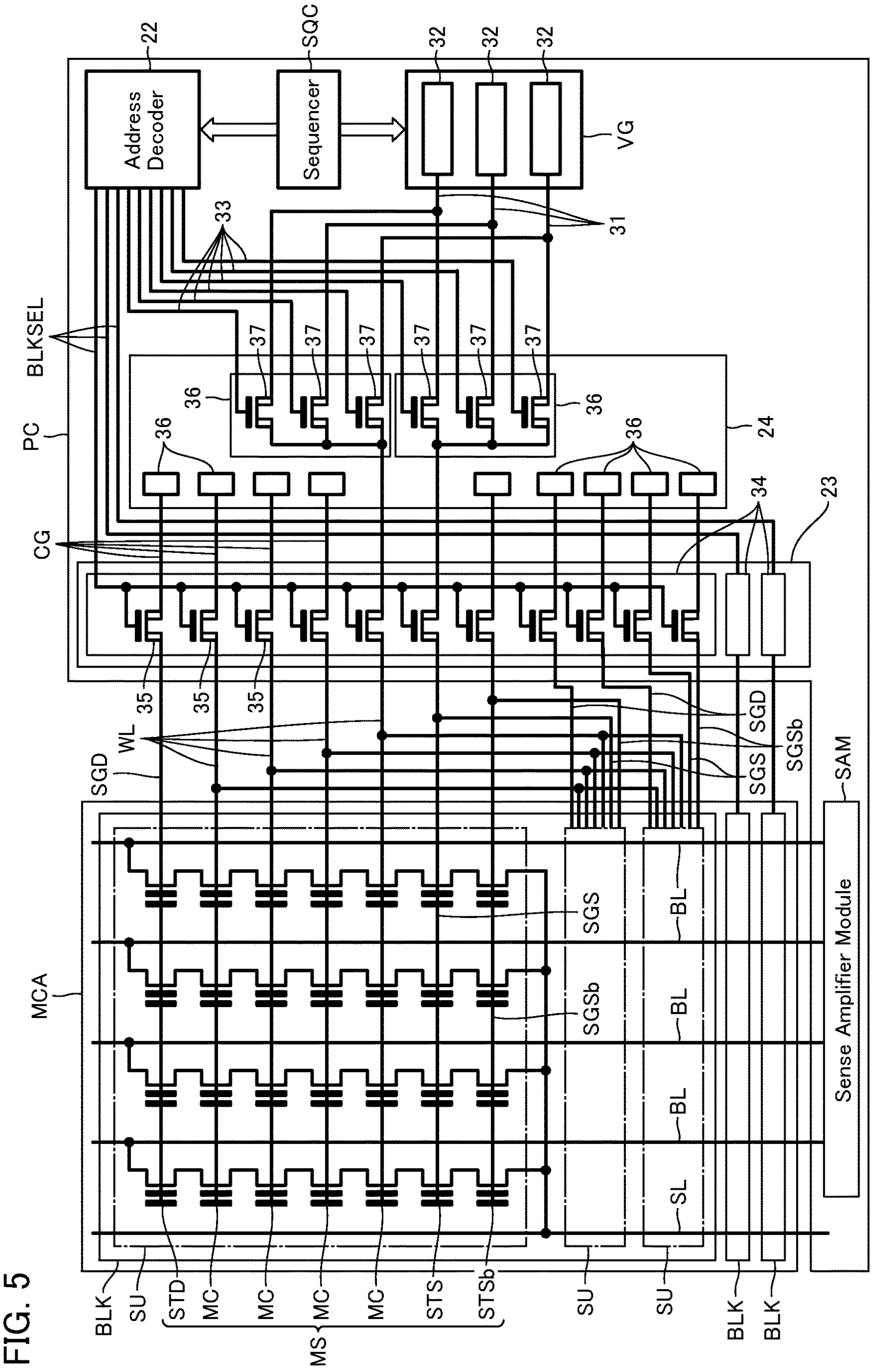
FIG. 5 is a schematic circuit diagram showing a configuration of a part of the memory die MD according to the first embodiment.
Figure 6:
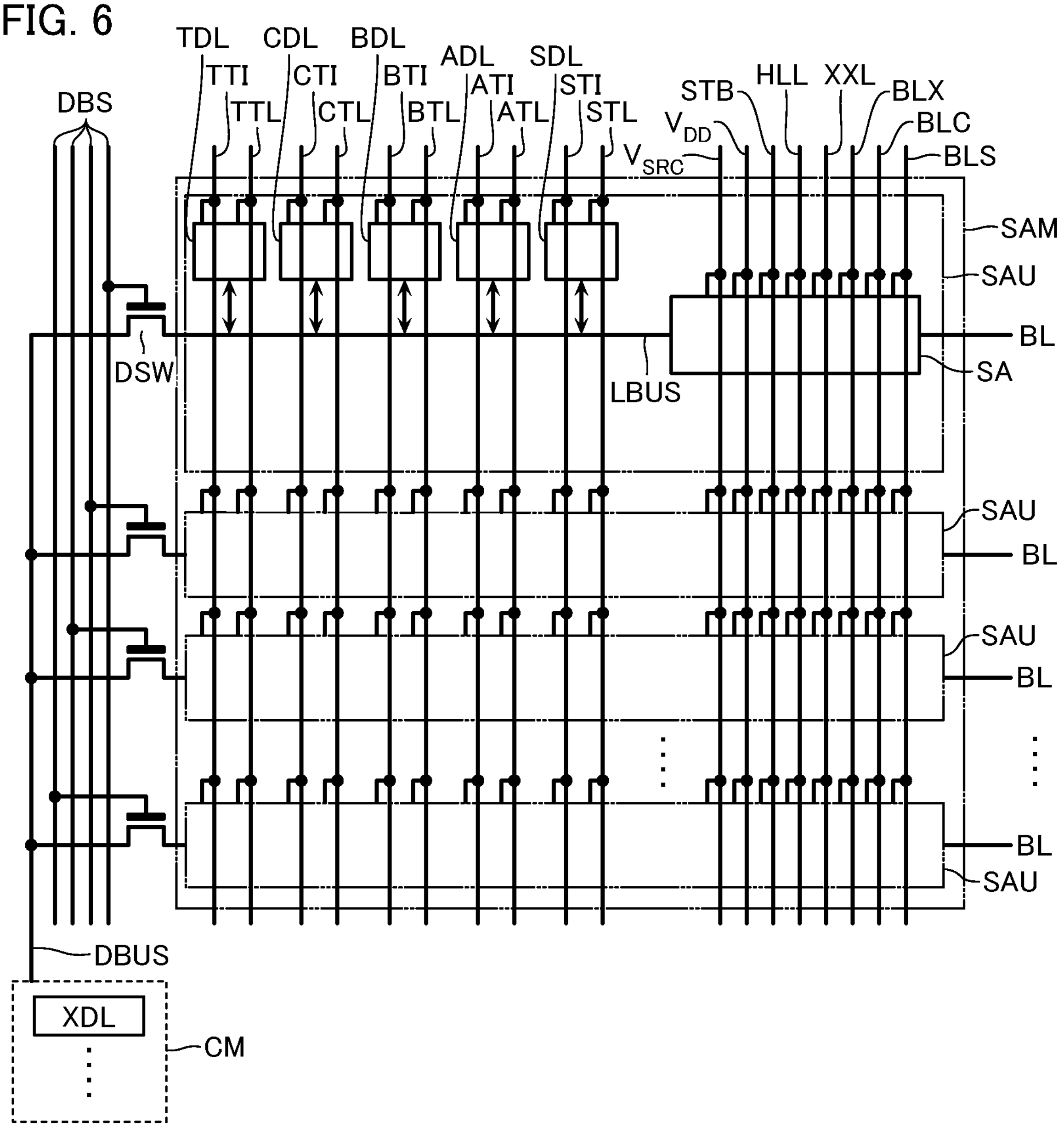
FIG. 6 is a schematic circuit diagram showing a configuration of a sense amplifier module SAM.
Figure 7:
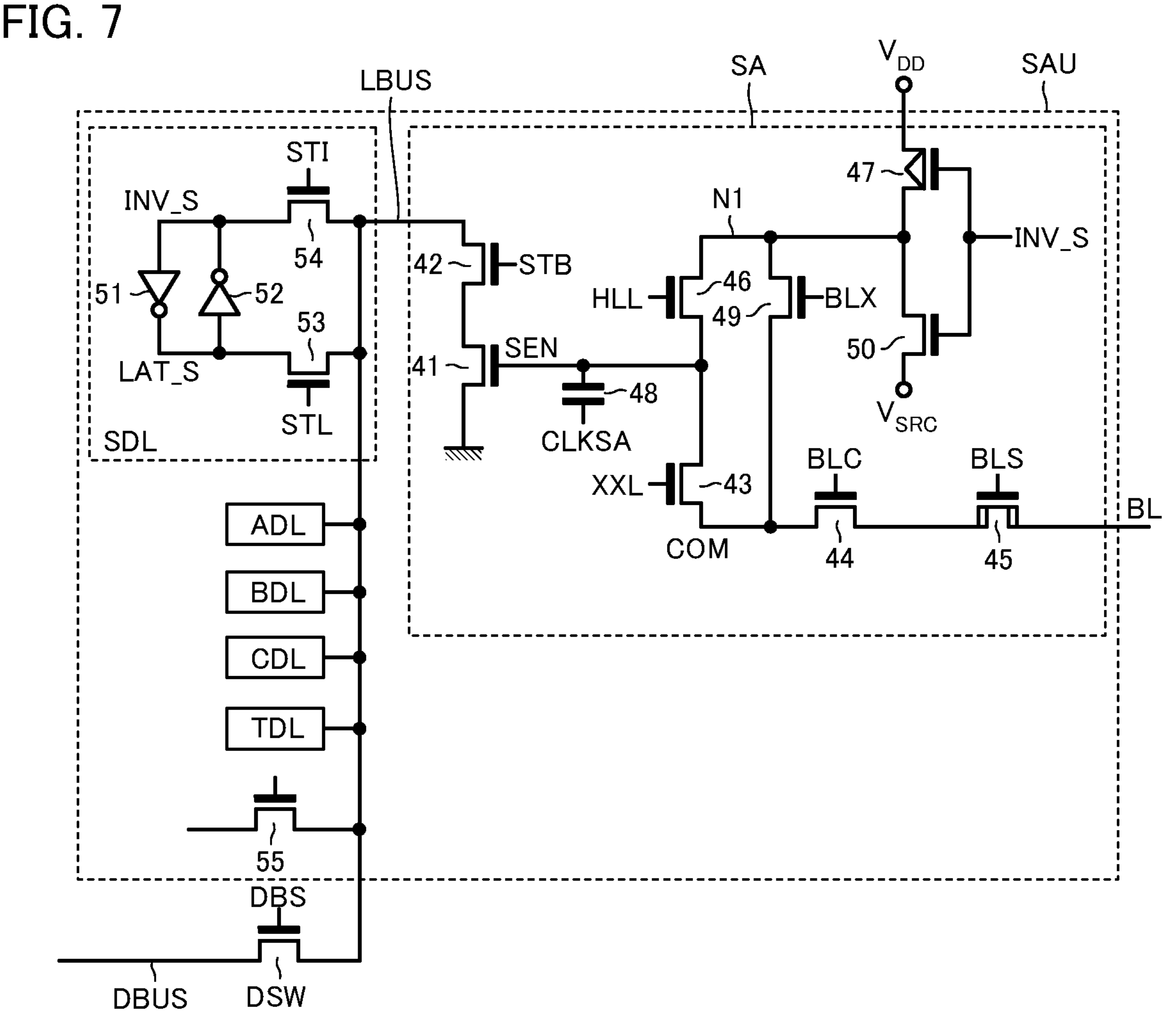
FIG. 7 is a schematic circuit diagram showing a configuration of a sense amplifier unit SAU.

FIG. 4 is a schematic block diagram showing a configuration of the memory die MD according to the first embodiment. FIG. 5 is a schematic circuit diagram showing a configuration of a part of the memory die MD according to the first embodiment. FIG. 6 is a schematic circuit diagram showing a configuration of a sense amplifier module SAM. FIG. 7 is a schematic circuit diagram showing a configuration of a sense amplifier unit SAU.

Note that in FIG. 4, a plurality of control terminals, and so on, are illustrated. These plurality of control terminals are sometimes indicated as a control terminal corresponding to a high active signal (a positive logic signal), sometimes indicated as a control terminal corresponding to a low active signal (a negative logic signal), and sometimes indicated as a control terminal corresponding to both a high active signal and a low active signal. In FIG. 4, a symbol of a control terminal corresponding to a low active signal includes an overline (an overbar). In the present specification, a symbol of a control terminal corresponding to a low active signal includes a slash ("/"). Note that description of FIG. 4 is an exemplification, and that a specific mode is appropriately adjustable. For example, it is possible too for a part of or all of the high active signals to be configured as low active signals, or for a part of or all of the low active signals to be configured as high active signals.

As shown in FIG. 4, the memory die MD comprises: a memory cell array MCA that stores data; and a peripheral circuit PC connected to the memory cell array MCA. The peripheral circuit PC comprises a voltage generating circuit VG, a row decoder RD, the sense amplifier module SAM, and a sequencer SQC. In addition, the peripheral circuit PC comprises a cache memory CM, an address register ADR, a command register CMR, and a status register STR. Moreover, the peripheral circuit PC comprises an input/output control circuit I/O and a logic circuit CTR.

[Circuit Configuration of Memory Cell Array MCA]

The memory cell array MCA comprises a plurality of memory blocks BLK, as shown in FIG. 5. These plurality of memory blocks BLK each comprise a plurality of string units SU. These plurality of string units SU each comprise a plurality of memory strings MS. One ends of these plurality of memory strings MS are respectively connected to the peripheral circuit PC via bit lines BL. Moreover, the other ends of these plurality of memory strings MS are each connected to the peripheral circuit PC via a common source line SL.

The memory string MS comprises a drain side select transistor STD, a plurality of memory cells MC (memory transistors), a source side select transistor STS, and a source side select transistor STSb that are connected in series between the bit line BL and the source line SL. Hereafter, the drain side select transistor STD, the source side select transistor STS, and the source side select transistor STSb will sometimes simply be referred to as select transistors (STD, STS, STSb).

The memory cell MC is a field effect type transistor comprising: a semiconductor layer functioning as a channel region; a gate insulating film including an electric charge accumulating film; and a gate electrode. A threshold voltage of the memory cell MC changes according to an amount of charge in the electric charge accumulating film. The memory cell MC stores 1 bit or a plurality of bits of data. Note that the plurality of memory cells MC corresponding to one memory string MS are respectively connected with word lines WL. These word lines WL respectively function as the gate electrodes of the memory cells MC included in all of the memory strings MS in one memory block BLK.

The select transistors (STD, STS, STSb) are field effect type transistors each comprising: a semiconductor layer functioning as a channel region; a gate insulating film; and a gate electrode. The gate electrodes of the select transistors (STD, STS, STSb) are respectively connected with select gate lines (SGD, SGS, SGSb). A drain side select gate line SGD is provided correspondingly to the string unit SU and functions as gate electrodes of the drain side select transistors STD included in all of the memory strings MS in one string unit SU. A source side select gate line SGS functions as gate electrodes of the source side select transistors STS included in all of the memory strings MS in a plurality of the string units SU. A source side select gate line SGSb functions as gate electrodes of the source side select transistors STSb included in all of the memory strings MS in a plurality of the string units SU.

[Circuit Configuration of Voltage Generating Circuit VG]

The voltage generating circuit VG (FIG. 4) is connected to a plurality of voltage supply lines 31, as shown in FIG. 5, for example. The voltage generating circuit VG includes a step-down circuit such as a regulator, and a booster circuit such as a charge pump circuit 32, for example. These step-down circuit and booster circuit are each connected to voltage supply lines applied with a power supply voltage $V_{CC}$ and a ground voltage $V_{SS}$ (FIG. 4). These voltage supply lines are connected to the pad electrodes P described with reference to FIGS. 2 and 3, for example. The voltage generating circuit VG generates and simultaneously outputs to the plurality of voltage supply lines 31 a plurality of types of operation voltages that are applied to the bit lines BL, the source line SL, the word lines WL, and the select gate lines (SGD, SGS, SGSb) during a read operation, a write operation, and an erase operation on the memory cell array MCA, according to a control signal from the sequencer SQC, for example. The operation voltages outputted from the voltage supply lines 31 are appropriately adjusted according to the control signal from the sequencer SQC.

[Circuit Configuration of Row Decoder RD]

As shown in FIG. 5, for example, the row decoder RD (FIG. 4) comprises: an address decoder 22 that decodes address data $D_{ADD}$; and a block select circuit 23 and voltage select circuit 24 that transfer an operation voltage to the memory cell array MCA in response to an output signal of the address decoder 22.

The address decoder 22 comprises a plurality of block select lines BLKSEL and a plurality of voltage select lines 33. The address decoder 22 sequentially refers to a row address RA of the address register ADR (FIG. 4) in accordance with a control signal from the sequencer SQC, and decodes this row address RA to set a certain block select transistor 35 and a certain voltage select transistor 37 corresponding to the row address RA to an ON state, and set a block select transistor 35 and a voltage select transistor 37 other than those to an OFF state, for example. For example, voltages of a certain block select line BLKSEL and a certain voltage select line 33 are set to an "H" state, and voltages of a block select line BLKSEL and a voltage select line 33 other than those are set to an "L" state. Note that when transistors of P-channel type and not N-channel type are employed, these wirings are applied with reverse voltages.

Note that in the example illustrated, the block select lines BLKSEL are provided one each for each one of the memory blocks BLK, in the address decoder 22. However, this configuration may be appropriately changed. For example, the block select lines BLKSEL may be provided one each for every two or more of the memory blocks BLK.

The block select circuit 23 comprises a plurality of block select portions 34 corresponding to the memory blocks BLK. These plurality of block select portions 34 each comprise a plurality of the block select transistors 35 corresponding to the word lines WL and to the select gate lines (SGD, SGS, SGSb). The block select transistor 35 is a field effect type voltage-withstanding transistor, for example. Drain electrodes of the block select transistors 35 are each electrically connected to a corresponding one of the word lines WL or select gate lines (SGD, SGS, SGSb). Source electrodes of the block select transistors 35 are each electrically connected to one of the voltage supply lines 31 via a wiring CG and the voltage select circuit 24. Gate electrodes of the block select transistors 35 are commonly connected to a corresponding one of the block select lines BLKSEL.

Note that the block select circuit 23 further comprises an unillustrated plurality of transistors. These plurality of transistors are field effect type high breakdown voltage transistors that are connected between the select gate lines (SGD, SGS, SGSb) and a voltage supply line applied with the ground voltage $V_{SS}$. These plurality of transistors apply the ground voltage $V_{SS}$ to the select gate lines (SGD, SGS, SGSb) included in an unselected memory block BLK. Note that the plurality of word lines WL included in the unselected memory block BLK are in a floating state.

The voltage select circuit 24 comprises a plurality of voltage select portions 36 corresponding to the word lines WL and to the select gate lines (SGD, SGS, SGSb). These plurality of voltage select portions 36 each comprise a plurality of the voltage select transistors 37. The voltage select transistor 37 is a field effect type voltage-withstanding transistor, for example. Drain terminals of the voltage select transistors 37 are each electrically connected to a corresponding one of the word lines WL or select gate lines (SGD, SGS, SGSb) via one of the wirings CG and the block select circuit 23. Source terminals of the voltage select transistors 37 are each electrically connected to a corresponding one of the voltage supply lines 31. Gate electrodes of the voltage select transistors 37 are each connected to a corresponding one of the voltage select lines 33.

Note that in the example illustrated, there is shown an example where the wiring CG is connected to the voltage supply line 31 via a single voltage select transistor 37. However, such a configuration is merely an exemplification, and specific configuration is appropriately adjustable. For example, the wiring CG may be connected to the voltage supply line 31 via two or more of the voltage select transistors 37.

[Circuit Configuration of Sense Amplifier Module SAM]

As shown in FIG. 6, for example, the sense amplifier module SAM (FIG. 4) comprises a plurality of the sense amplifier units SAU corresponding to a plurality of the bit lines BL. The sense amplifier units SAU each comprise: a sense amplifier SA connected to the bit line BL; a wiring LBUS connected to the sense amplifier SA; latch circuits SDL, ADL, BDL, CDL, TDL connected to the wiring LBUS; and a charge transistor for pre-charge 55 (FIG. 7), connected to the wiring LBUS. The wiring LBUS in the sense amplifier unit SAU is connected to a wiring DBUS via a switch transistor DSW.

As shown in FIG. 7, the sense amplifier SA comprises a sense transistor 41 that discharges a charge of the wiring LBUS depending on a current flowing in the bit line BL. A source electrode of the sense transistor 41 is connected to a voltage supply line applied with the ground voltage $V_{SS}$. A drain electrode of the sense transistor 41 is connected to the wiring LBUS via a switch transistor 42. A gate electrode of the sense transistor 41 is connected to the bit line BL via a sense node SEN, a discharge transistor 43, a node COM, a clamp transistor 44, and a voltage-withstanding transistor 45. Note that the sense node SEN is connected to an internal control signal line CLKSA via a capacitor 48.

Moreover, the sense amplifier SA comprises a voltage transfer circuit that selectively causes the node COM and the sense node SEN to be electrically continuous with a voltage supply line applied with a voltage $V_{DD}$ or a voltage supply line applied with a voltage $V_{SRC}$, depending on data latched in the latch circuit SDL. This voltage transfer circuit comprises: a node N1; a charge transistor 46 connected between the node N1 and the sense node SEN; a charge transistor 49 connected between the node N1 and the node COM; a charge transistor 47 connected between the node N1 and the voltage supply line applied with the voltage $V_{DD}$; and a discharge transistor 50 connected between the node N1 and the voltage supply line applied with the voltage $V_{SRC}$. Note that gate electrodes of the charge transistor 47 and the discharge transistor 50 are commonly connected to a node INV_S of the latch circuit SDL.

Note that the sense transistor 41, the switch transistor 42, the discharge transistor 43, the clamp transistor 44, the charge transistor 46, the charge transistor 49, and the discharge transistor 50 are enhancement type NMOS transistors, for example. The voltage-withstanding transistor 45 is a depression type NMOS transistor, for example. The charge transistor 47 is a PMOS transistor, for example.

Moreover, a gate electrode of the switch transistor 42 is connected to a signal line STB. A gate electrode of the discharge transistor 43 is connected to a signal line XXL. A gate electrode of the clamp transistor 44 is connected to a signal line BLC. A gate electrode of the voltage-withstanding transistor 45 is connected to a signal line BLS. A gate electrode of the charge transistor 46 is connected to a signal line HLL. A gate electrode of the charge transistor 49 is connected to a signal line BLX. These signal lines STB, XXL, BLC, BLS, HLL, BLX are connected to the sequencer SQC.

The latch circuit SDL comprises: a node LAT_S and the node INV_S; an inverter 51 comprising an output terminal connected to the node LAT_S and an input terminal connected to the node INV_S; an inverter 52 comprising an input terminal connected to the node LAT_S and an output terminal connected to the node INV_S; a switch transistor 53 connected to the node LAT_S and the wiring LBUS; and a switch transistor 54 connected to the node INV_S and the wiring LBUS. The switch transistors 53, 54 are NMOS transistors, for example. A gate electrode of the switch transistor 53 is connected to the sequencer SQC via a signal line STL. A gate electrode of the switch transistor 54 is connected to the sequencer SQC via a signal line STI.

The latch circuits ADL, BDL, CDL, TDL are configured substantially similarly to the latch circuit SDL. However, as mentioned above, the node INV_S of the latch circuit SDL is electrically continuous with the gate electrodes of the charge transistor 47 and the discharge transistor 50 in the sense amplifier SA. The latch circuits ADL, BDL, CDL, TDL differ from the latch circuit SDL in this respect.

The switch transistor DSW is an NMOS transistor, for example. The switch transistor DSW is connected between the wiring LBUS and the wiring DBUS. A gate electrode of the switch transistor DSW is connected to the sequencer SQC via a signal line DBS (FIG. 6).

Note that as exemplified in FIG. 6, the above-mentioned signal lines STB, HLL, XXL, BLX, BLC, BLS are each commonly connected between all the sense amplifier units SAU included in the sense amplifier module SAM. Moreover, the above-mentioned voltage supply line applied with the voltage $V_{DD}$ and voltage supply line applied with the voltage $V_{SRC}$ are both commonly connected between all the sense amplifier units SAU included in the sense amplifier module SAM. Moreover, the signal line STI and the signal line STL of the latch circuit SDL are both commonly connected between all the sense amplifier units SAU included in the sense amplifier module SAM. Similarly, signal lines ATI, BTI, CTI, TTI and signal lines ATL, BTL, CTL, TTL corresponding to the signal line STI and the signal line STL in the latch circuits ADL, BDL, CDL, TDL are each commonly connected between all the sense amplifier units SAU included in the sense amplifier module SAM. On the other hand, a plurality of the above-mentioned signal lines DBS are respectively provided correspondingly to all the sense amplifier units SAU included in the sense amplifier module SAM.

Circuit Configuration of Cache Memory CM

The cache memory CM (FIG. 4) comprises a plurality of latch circuits XDL that are connected to the latch circuits ADL, BDL, CDL, TDL in the sense amplifier module SAM via the wiring DBUS. Data DAT included in these plurality of latch circuits XDL is sequentially transferred to the sense amplifier module SAM or to the input/output control circuit I/O.

Moreover, the cache memory CM is connected with an unillustrated decode circuit and an unillustrated switch circuit. The decode circuit decodes a column address CA latched in the address register ADR (FIG. 4). The switch circuit causes a latch circuit corresponding to the column address CA to be electrically continuous with a bus DB (FIG. 4), depending on an output signal of the decode circuit.

[Circuit Configuration of Sequencer SQC]

The sequencer SQC (FIG. 4) outputs internal control signals to the row decoder RD, the sense amplifier module SAM, and the voltage generating circuit VG, in accordance with command data $D_{CMD}$ latched in the command register CMR. In addition, the sequencer SQC appropriately outputs to the status register STR status data $D_{ST}$ indicating a state of the sequencer SQC itself.

Moreover, the sequencer SQC generates a ready/busy signal, and outputs the ready/busy signal to a terminal RY//BY. In a period when the terminal RY//BY is in an "L" state (a busy period), access to the memory die MD is basically prohibited. Moreover, in a period when the terminal RY//BY is in an "H" state (a ready period), access to the memory die MD is permitted. Note that the terminal RY//BY is realized by the pad electrode P described with reference to FIGS. 2 and 3, for example.

[Circuit Configuration of Input/Output Control Circuit I/O]

The input/output control circuit I/O comprises: data signal input/output terminals DQ0-DQ7; clock signal input/output terminals DQS, /DQS; and an input circuit such as a comparator and output circuit such as an OCD (Off Chip Driver) circuit that are connected to the data signal input/output terminals DQ0 to DQ7. In addition, the input/output control circuit I/O comprises: a shift register connected to these input circuit and output circuit; and a buffer circuit. The input circuit, the output circuit, the shift register, and the buffer circuit are each connected to terminals applied with a power supply voltage $V_{CCQ}$ and with the ground voltage $V_{SS}$. The data signal input/output terminals DQ0 to DQ7, the clock signal input/output terminals DQS, /DQS, and the terminal applied with the power supply voltage $V_{CCQ}$ are realized by the pad electrode P described with reference to FIGS. 2 and 3, for example. Data inputted via the data signal input/output terminals DQ0 to DQ7 is outputted to the cache memory CM, the address register ADR, or the command register CMR from the buffer circuit, in response to an internal control signal from the logic circuit CTR. Moreover, data outputted via the data signal input/output terminals DQ0 to DQ7 is inputted to the buffer circuit from the cache memory CM or the status register STR, in response to an internal control signal from the logic circuit CTR.

[Circuit Configuration of Logic Circuit CTR]

The logic circuit CTR (FIG. 4) receives an external control signal from the controller die CD via external control terminals /CEn, CLE, ALE, /WE, RE, /RE, and outputs an internal control signal to the input/output control circuit I/O depending on this external control signal. Note that the external control terminals /CEn, CLE, ALE, /WE, RE, /RE are realized by the pad electrode P described with reference to FIGS. 2 and 3, for example.

[Structure of Memory Die MD]

Figure 8:
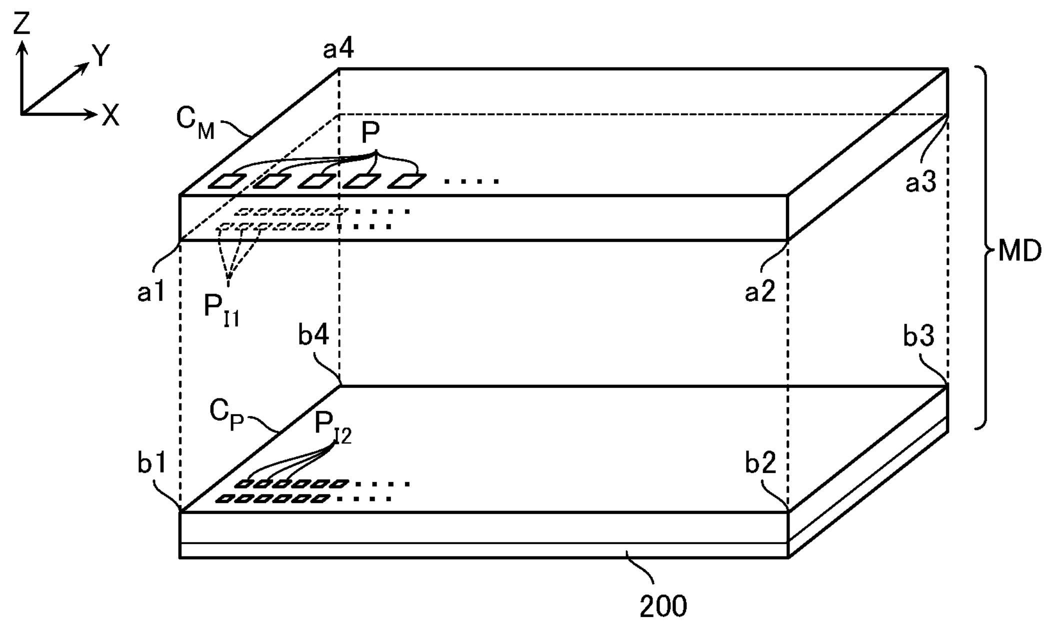
FIG. 8 is a schematic exploded perspective view showing a configuration example of the semiconductor memory device according to the first embodiment.

FIG. 8 is a schematic exploded perspective view showing a configuration example of the semiconductor memory device according to the first embodiment. As shown in FIG. 8, the memory die MD comprises: a chip $C_M$ on a memory cell array MCA side; and a chip $C_P$ on a peripheral circuit PC side.

An upper surface of the chip $C_M$ is provided with a plurality of the pad electrodes P that are connectable to the bonding wires B. Moreover, a lower surface of the chip $C_M$ is provided with a plurality of bonding electrodes $P_{I1}$. Moreover, an upper surface of the chip $C_P$ is provided with a plurality of bonding electrodes $P_{I2}$. Hereafter, a surface provided with the plurality of bonding electrodes $P_{I1}$, of the chip $C_M$ will be referred to as a front surface of the chip $C_M$, and a surface provided with the plurality of pad electrodes P, of the chip $C_M$ will be referred to as a back surface of the chip $C_M$. Moreover, a surface provided with the plurality of bonding electrodes $P_{I2}$, of the chip $C_P$ will be referred to as a front surface of the chip $C_P$, and a surface on an opposite side to the front surface, of the chip $C_P$ will be referred to as a back surface of the chip $C_P$. In the example illustrated, the front surface of the chip $C_P$ is provided above the back surface of the chip $C_P$, and the back surface of the chip $C_M$ is provided above the front surface of the chip $C_M$.

The chip $C_M$ and the chip $C_P$ are disposed so that the front surface of the chip $C_M$ and the front surface of the chip $C_P$ face each other. The plurality of bonding electrodes $P_{I1}$ are respectively provided correspondingly to the plurality of bonding electrodes $P_{I2}$, and are disposed at positions enabling bonding to the plurality of bonding electrodes $P_{I2}$. The bonding electrodes $P_{I1}$ and the bonding electrodes $P_{I2}$ function as bonding electrodes for bonding and making electrically continuous the chip $C_M$ and the chip $C_P$.

Note that in the example of FIG. 8, corners a1, a2, a3, a4 of the chip $C_M$ respectively correspond to corners b1, b2, b3, b4 of the chip $C_P$. As shown in FIG. 8, the chip $C_P$ comprises a semiconductor substrate 200. Transistors included in the peripheral circuit PC are formed on an upper surface of the semiconductor substrate 200.

Figure 9:
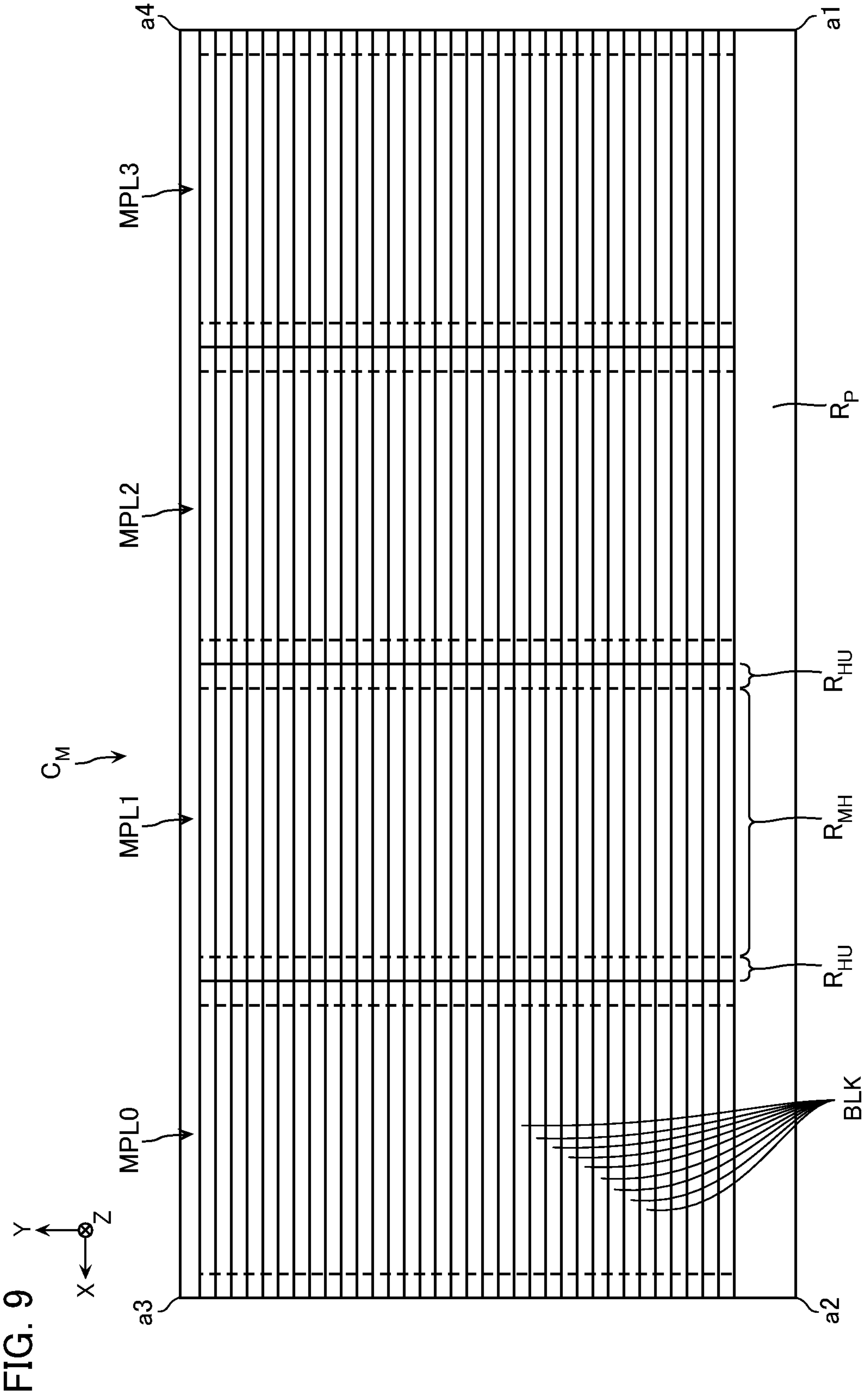
FIG. 9 is a schematic bottom view showing a configuration example of a chip $C_M$.
Figure 10:
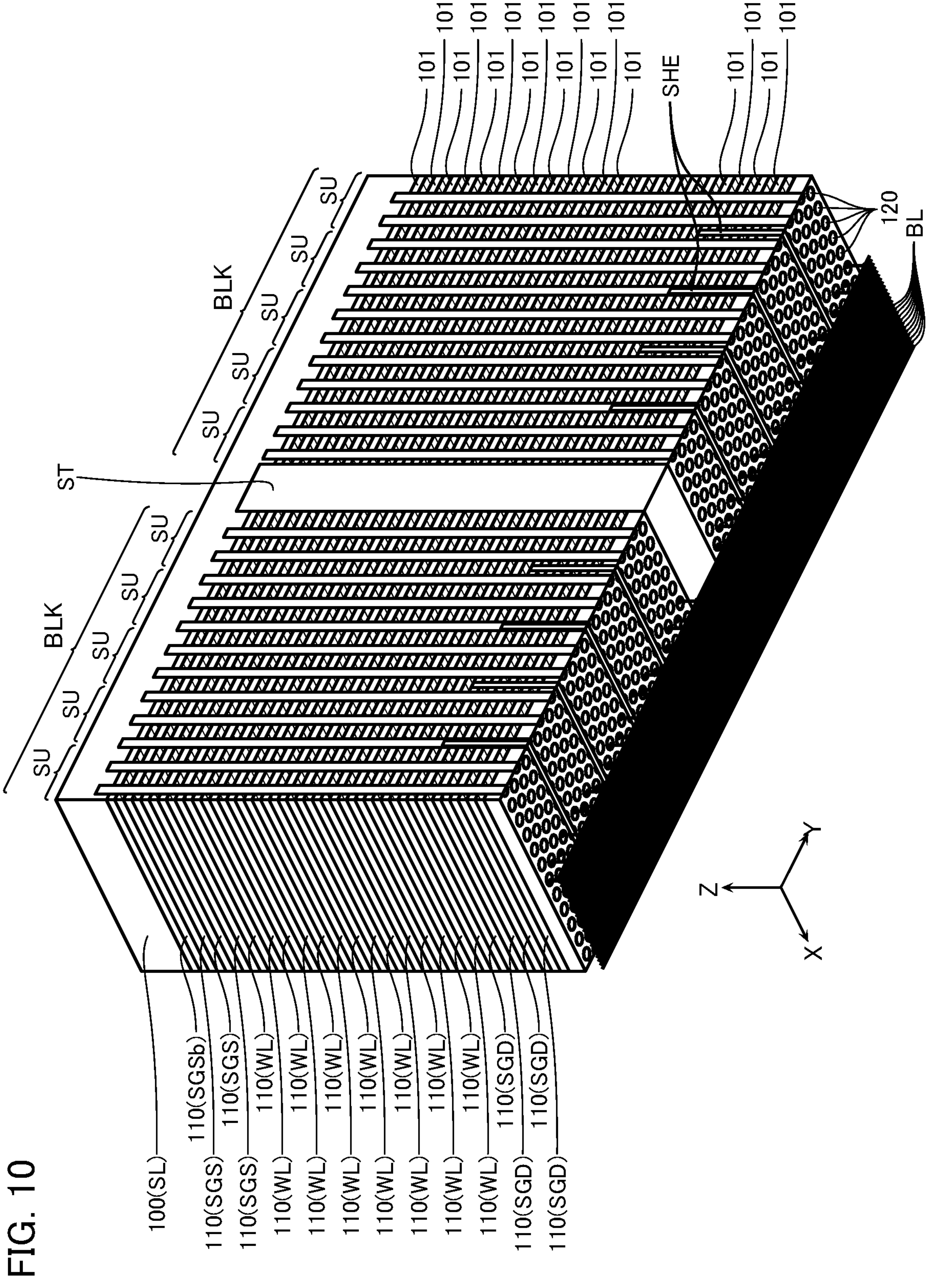
FIG. 10 is a schematic perspective view showing a configuration of a part of a memory cell array MCA.
Figure 11:
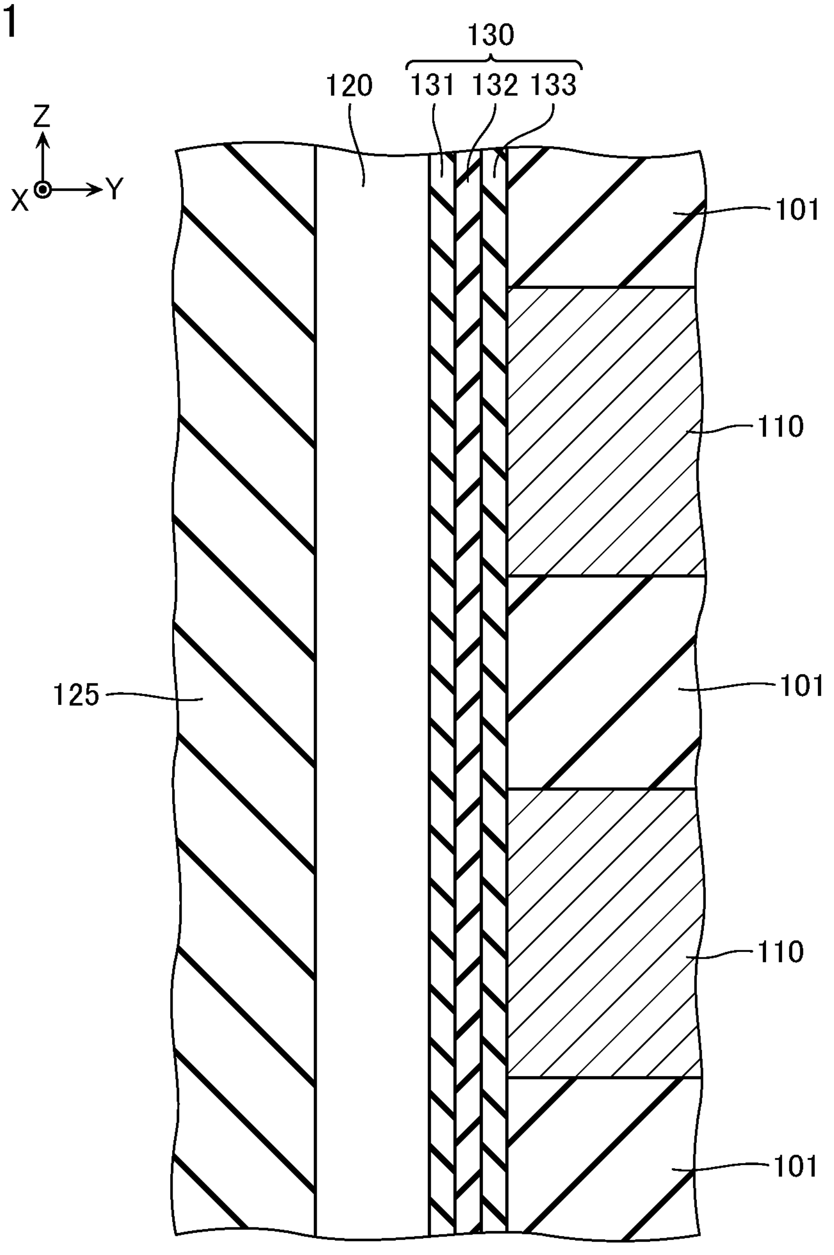
FIG. 11 is a schematic cross-sectional view showing a configuration of a part of the memory cell array MCA.

FIG. 9 is a schematic bottom view showing a configuration example of the chip $C_M$. In FIG. 9, a part of the configuration such as the bonding electrodes $P_{I1}$ are omitted. FIG. 10 is a schematic perspective view showing a configuration a part of the memory cell array MCA. FIG. 11 is a schematic cross-sectional view showing a configuration a part of the memory cell array MCA.

[Structure of Chip $C_M$]

In the example of FIG. 9, the chip $C_M$ comprises four memory planes MPL0, MPL1, MPL2, MPL3 arranged in the X-direction. The four memory planes MPL0 to MPL3 each correspond to the memory cell array MCA (FIG. 5). Moreover, these four memory planes MPL0 to MPL3 each comprise a plurality of the memory blocks BLK arranged in the Y-direction. Moreover, in the example of FIG. 9, the plurality of memory blocks BLK each comprise: a hook-up region $R_{HU}$ provided in both end portions in the X-direction of the memory block BLK; and a memory hole region $R_{MH}$ provided between these hook-up regions $R_{HU}$. Moreover, the chip $C_M$ comprises a peripheral region $R_P$ provided further to a side on one end in the Y-direction of the chip $C_M$ than the four memory planes MPL0 to MPL3.

Note that in the example illustrated, the hook-up region $R_{HU}$ is provided in both end portions in the X-direction of each of the memory planes MPL0 to MPL3. However, such a configuration is merely an exemplification, and specific configuration may be appropriately adjusted. For example, the hook-up region $R_{HU}$ may be provided in one end portion in the X-direction of each of the memory planes MPL0 to MPL3, rather than in both end portions in the X-direction of each of the memory planes MPL0 to MPL3. Moreover, the hook-up region $R_{HU}$ may be provided at a center position or near center position in the X-direction of each of the memory planes MPL0 to MPL3.

As shown in FIG. 10, the plurality of memory blocks BLK in the memory cell array MCA are arranged in the Y-direction. Moreover, the plurality of string units SU in the memory block BLK are arranged in the Y-direction. An inter-block insulating layer ST of the likes of silicon oxide ($SiO_2$) is provided between two memory blocks BLK adjacent in the Y-direction. An inter-string unit insulating layer SHE of the likes of silicon oxide ($SiO_2$) is provided between two string units SU adjacent in the Y-direction.

The memory block BLK comprises: a plurality of conductive layers 110 arranged in the Z-direction; and a plurality of semiconductor layers 120 extending in the Z-direction. Moreover, as shown in FIG. 11, gate insulating films 130 are respectively provided between the plurality of conductive layers 110 and the plurality of semiconductor layers 120.

As shown in FIG. 10, the conductive layer 110 comprises a substantially plate-like shape extending in the X-direction. The conductive layer 110 may include a stacked film of a barrier conductive film of the likes of titanium nitride (TiN) and a metal film of the likes of tungsten (W), or the like. Moreover, the conductive layer 110 may include the likes of polycrystalline silicon including an impurity such as phosphorus (P) or boron (B), for example. An insulating layer 101 of the likes of silicon oxide ($SiO_2$) is provided between the plurality of conductive layers 110 arranged in the Z-direction.

A part of the plurality of conductive layers 110 function as the word lines WL (FIG. 5) and as the gate electrodes of the plurality of memory cells MC (FIG. 5) connected to these word lines WL. In the description below, such conductive layers 110 will sometimes be referred to as conductive layers 110(WL). These plurality of conductive layers 110(WL) are each electrically independent every memory block BLK.

One or a plurality of conductive layers 110 located above the plurality of conductive layers 110(WL) function as the source side select gate line SGS (FIG. 5) and as the gate electrodes of the plurality of source side select transistors STS (FIG. 5) connected to this source side select gate line SGS. In the description below, such conductive layers 110 will sometimes be referred to as conductive layers 110 (SGS). These one or plurality of conductive layers 110(SGS) are electrically independent every memory block BLK.

One or a plurality of conductive layers 110 located below the plurality of conductive layers 110(WL) function as the drain side select gate line SGD (FIG. 5) and as the gate electrodes of the plurality of drain side select transistors STD (FIG. 5) connected to this drain side select gate line SGD. In the description below, such conductive layers 110 will sometimes be referred to as conductive layers 110 (SGD). Width in the Y-direction of these plurality of conductive layers 110(SGD) is smaller than width in the Y-direction of the conductive layers 110(WL). Moreover, the inter-string unit insulating layer SHE is provided between two conductive layers 110(SGD) adjacent in the Y-direction in one memory block BLK. These plurality of conductive layers 110(SGD) are each electrically independent every string unit SU.

A conductive layer 100 is provided above the plurality of conductive layers 110. The conductive layer 100 is connected to an upper end of the semiconductor layer 120. The conductive layer 100 may include the likes of polycrystalline silicon including an N-type impurity such as phosphorus (P), or may include a conductive layer of the likes of a metal such as tungsten (W) or tungsten silicide, or another conductive layer, for example. Moreover, the insulating layer 101 of the likes of silicon oxide ($SiO_2$) is provided between the conductive layer 100 and the conductive layer 110.

The conductive layer 100 functions as the source line SL (FIG. 5). The source line SL is commonly provided for all of the memory blocks BLK included in the memory cell array MCA, for example.

The semiconductor layers 120 are arranged in a certain pattern in the X-direction and the Y-direction. The semiconductor layer 120 functions as channel regions of the plurality of memory cells MC and the select transistors (STD, STS) included in one memory string MS (FIG. 5). The semiconductor layer 120 includes the likes of polycrystalline silicon (Si), for example. The semiconductor layer 120 has a substantially bottomed cylindrical shape, and, as shown in FIG. 11, for example, has its central portion provided with an insulating layer 125 of the likes of silicon oxide. Moreover, an outer peripheral surface of the semiconductor layer 120 is surrounded by respective ones of the conductive layers 110, and faces the conductive layers 110.

A lower end portion of the semiconductor layer 120 is provided with an unillustrated impurity region that includes an N-type impurity such as phosphorus (P). This impurity region is connected to the bit line BL via a via contact electrode.

An upper end portion of the semiconductor layer 120 is provided with an unillustrated impurity region that includes an N-type impurity such as phosphorus (P). This impurity region is connected to the conductive layer 100.

The gate insulating film 130 has a substantially bottomed cylindrical shape covering the outer peripheral surface of the semiconductor layer 120. The gate insulating film 130 comprises a tunnel insulating film 131, an electric charge accumulating film 132, and a block insulating film 133 that are stacked between the semiconductor layer 120 and the conductive layers 110, as shown in FIG. 11, for example. The tunnel insulating film 131 and the block insulating film 133 include the likes of silicon oxide ($SiO_2$), for example. The electric charge accumulating film 132 includes a film capable of accumulating a charge, of the likes of silicon nitride (SiN), for example. The tunnel insulating film 131, the electric charge accumulating film 132, and the block insulating film 133 have substantially cylindrical shapes, and extend in the Z-direction along the outer peripheral surface of the semiconductor layer 120 excluding a contact portion between the semiconductor layer 120 and the conductive layer 100.

Note that FIG. 11 shows an example where the gate insulating film 130 comprises the electric charge accumulating film 132 of the likes of silicon nitride. However, the gate insulating film 130 may comprise a floating gate of the likes of polycrystalline silicon including an N-type or P-type impurity, for example.

[Threshold Voltage of Memory Cell MC]

Figures 12A, 12B:
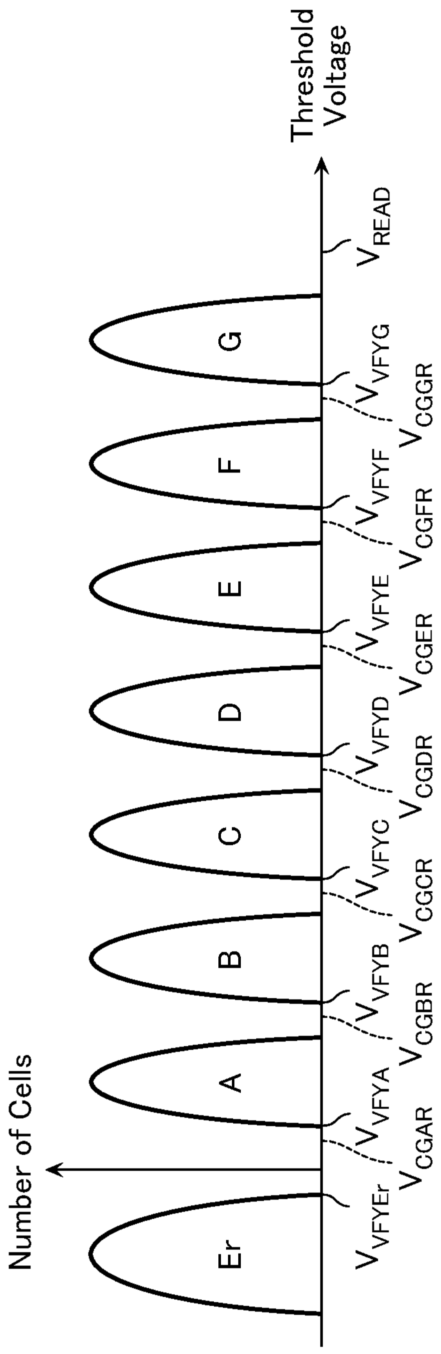
FIG. 12A is a schematic histogram for explaining a threshold voltage of a memory cell MC stored with 3 bits of data.
FIG. 12B is a table showing one example of a relationship of the threshold voltage and the stored data of the memory cell MC stored with 3 bits of data.

Next, a threshold voltage of the memory cell MC storing multiple bits of data will be described with reference to FIGS. 12A and 12B. FIGS. 12A and 12B show as an example the threshold voltage of the memory cell MC storing 3 bits of data.

FIG. 12A is a schematic histogram for explaining a threshold voltage of the memory cell MC stored with 3 bits of data. The horizontal axis indicates voltage of the word line WL, and the vertical axis indicates number of memory cells MC. FIG. 12B is a table showing one example of a relationship of the threshold voltage and stored data of the memory cell MC stored with 3 bits of data.

In the example of FIG. 12A, the threshold voltage of the memory cell MC is controlled to eight types of states. The threshold voltage of the memory cell MC controlled to an Er state is smaller than an erase verify voltage $V_{VFYEr}$. Moreover, for example, the threshold voltage of the memory cell MC controlled to an A state is larger than a verify voltage $V_{VFYA}$, but smaller than a verify voltage $V_{VFYB}$. Moreover, for example, the threshold voltage of the memory cell MC controlled to a B state is larger than the verify voltage $V_{VFYB}$, but smaller than a verify voltage $V_{VFYC}$. Likewise, the threshold voltages of the memory cells MC controlled to a C state to an F state are respectively larger than the verify voltage $V_{VFYC}$ to a verify voltage $V_{VFYF}$, but smaller than a verify voltage $V_{VFYD}$ to a verify voltage $V_{VFYG}$. Moreover, for example, the threshold voltage of the memory cell MC controlled to a G state is larger than the verify voltage $V_{VFYG}$, but smaller than a read pass voltage $V_{READ}$.

Moreover, in the example of FIG. 12A, a read voltage $V_{CGAR}$ is set between a threshold voltage distribution corresponding to the Er state and a threshold voltage distribution corresponding to the A state. Moreover, a read voltage $V_{CGBR}$ is set between the threshold voltage distribution corresponding to the A state and a threshold voltage distribution corresponding to the B state. Likewise, a read voltage $V_{CGCR}$ to a read voltage $V_{CGGR}$ are respectively set through between the threshold voltage distribution corresponding to the B state and a threshold voltage distribution corresponding to the C state and between a threshold voltage distribution corresponding to the F state and a threshold voltage distribution corresponding to the G state.

For example, the Er state corresponds to a lowest threshold voltage. The memory cell MC in the Er state is the memory cell MC in an erased state, for example. The memory cell MC in the Er state is assigned with data "111", for example.

Moreover, the A state corresponds to a threshold voltage larger than the threshold voltage corresponding to the above-described Er state. The memory cell MC in the A state is assigned with data "110", for example.

Moreover, the B state corresponds to a threshold voltage larger than the threshold voltage corresponding to the above-described A state. The memory cell MC in the B state is assigned with data "100", for example.

Likewise, the C state to the G state in the drawings correspond to threshold voltages which are larger than the threshold voltages corresponding to the B state to the F state. The memory cells MC in these states are assigned with data "000", "010", "011", "001", "101", for example.

Note that in the case of assignation of the kind exemplified in FIG. 12B, lower bit (lower page: LP: Lower Page) data is discriminable by the two read voltages $V_{CGAR}$, $V_{CGER}$; middle bit (middle page: MP: Middle Page) data is discriminable by the three read voltages $V_{CGBR}$, $V_{CGDR}$, $V_{CGFR}$; and upper bit (upper page: UP: Upper Page) data is discriminable by the two read voltages $V_{CGCR}$, $V_{CGGR}$. This kind of data assignation is sometimes referred to as a 2-3-2 code.

Note that the number of bits of data stored in the memory cell MC, the number of states, the assignation of data to each of the states, and so on, may be appropriately changed.

[Data Stored in Latch Circuits]

FIG. 13 is a view showing data stored in the latch circuits XDL, ADL, BDL, CDL, TDL, SDL. As shown in FIG. 13, for example, the latch circuit XDL stores data read by the sense amplifier module SAM and data transferred from the input/output control circuit I/O. The latch circuit ADL stores lower page (Lower Page) data. The latch circuit BDL stores middle page (Middle Page) data. The latch circuit CDL stores upper page (Upper Page) data. The latch circuit TDL stores QPW data indicating whether a later-mentioned quick pass write (Quick Pass Write: QPW) program operation is to be executed, or not. The latch circuit SDL stores data controlling the sense amplifier SA, as mentioned above.

[Write Operation]

Next, a write operation of the semiconductor memory device according to the present embodiment will be described with reference to FIGS. 14 to 22.

Figure 14:
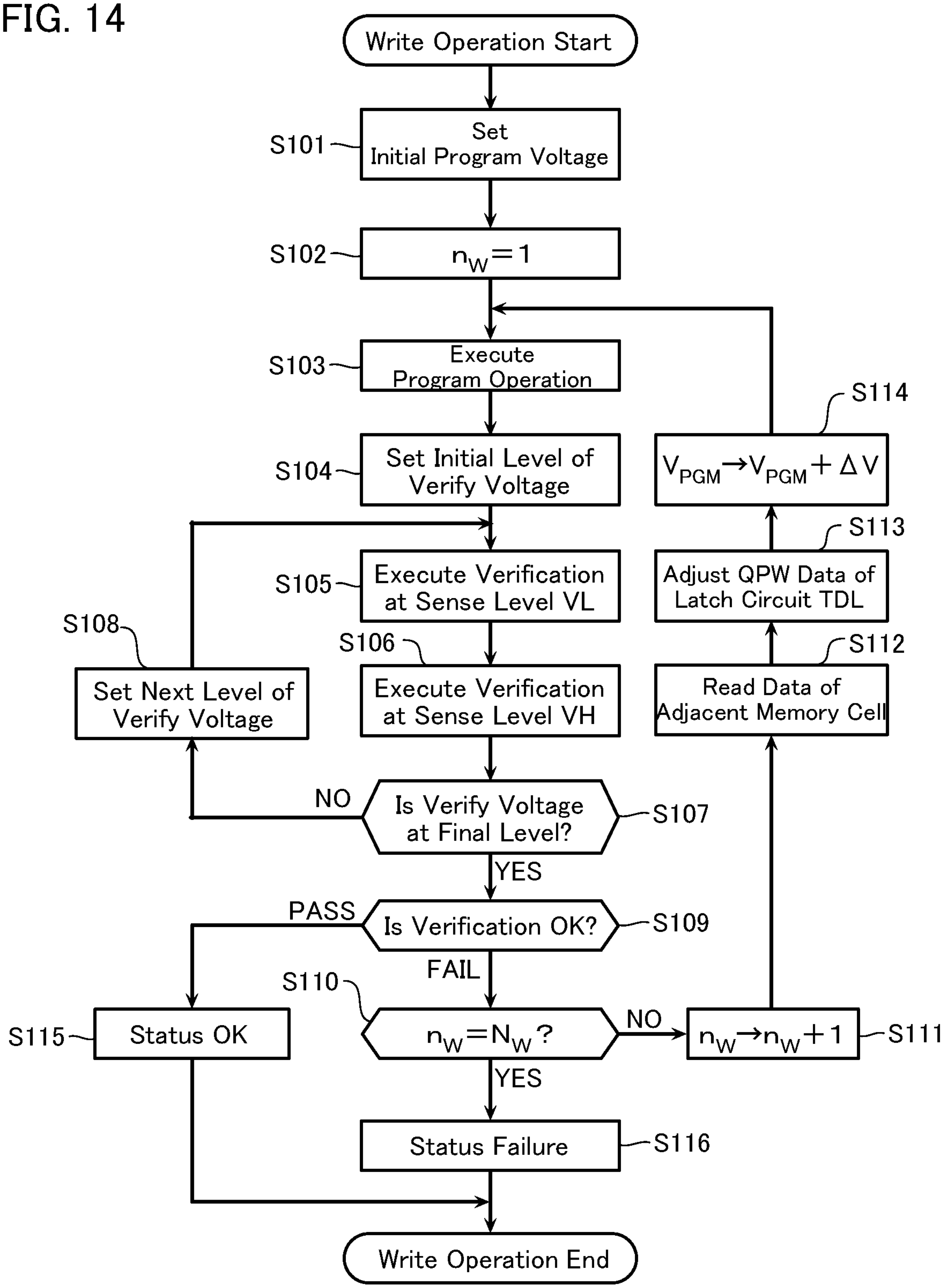
FIG. 14 is a schematic flowchart for explaining a write operation according to the first embodiment.
Figure 15:
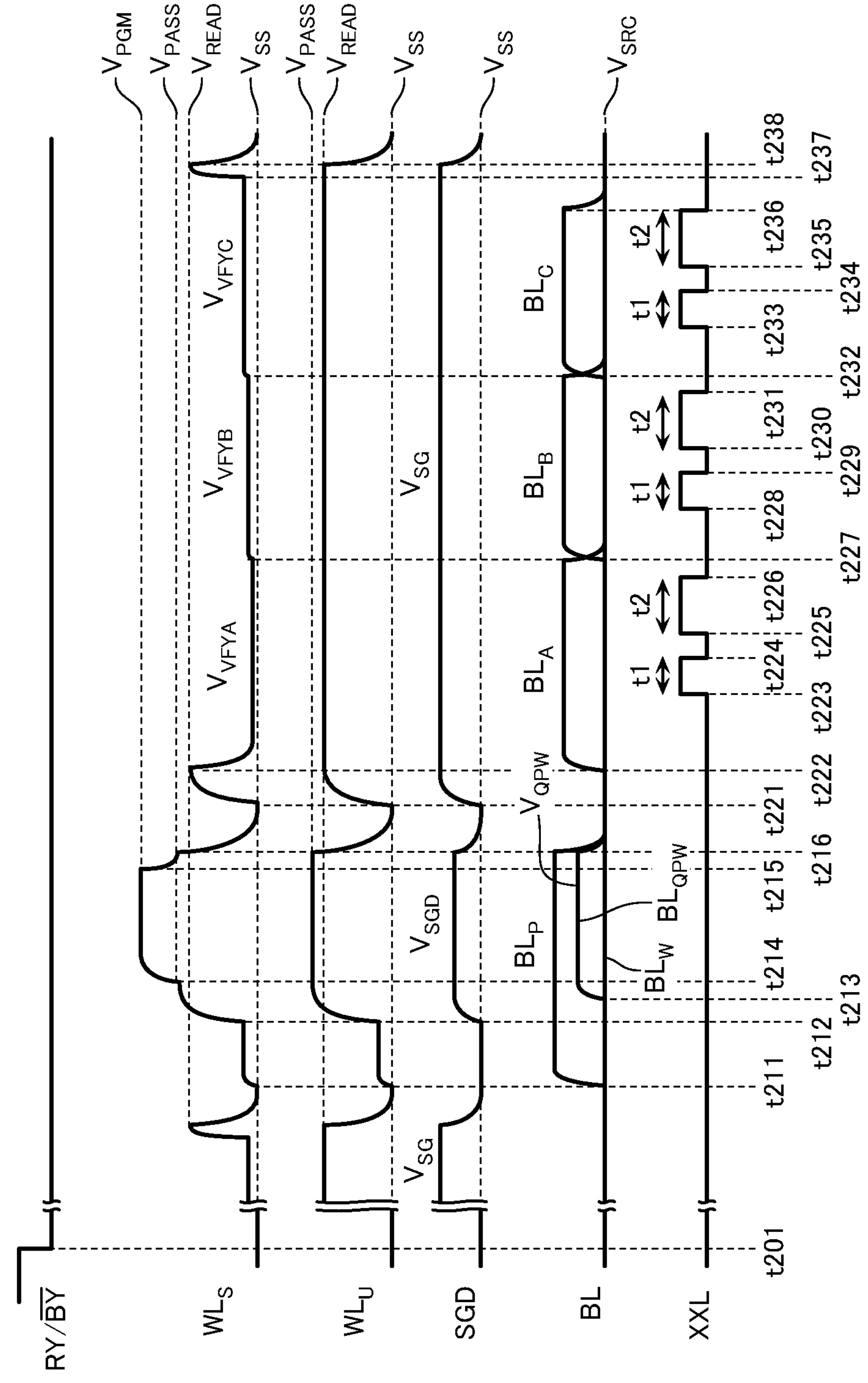
FIG. 15 is a schematic waveform diagram for explaining the write operation according to the first embodiment.
Figure 16:
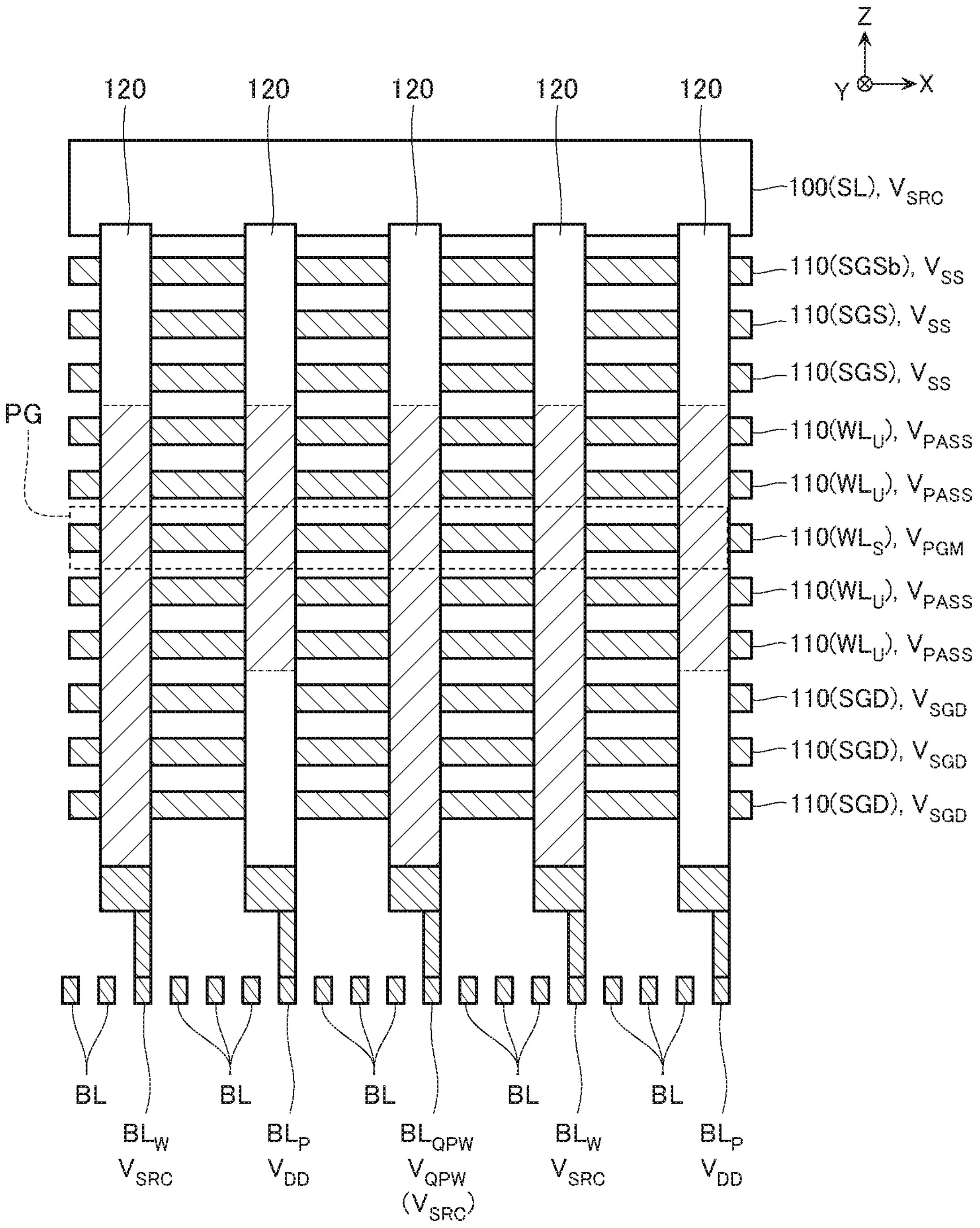
FIG. 16 is a schematic cross-sectional view for explaining a program operation.
Figure 17:
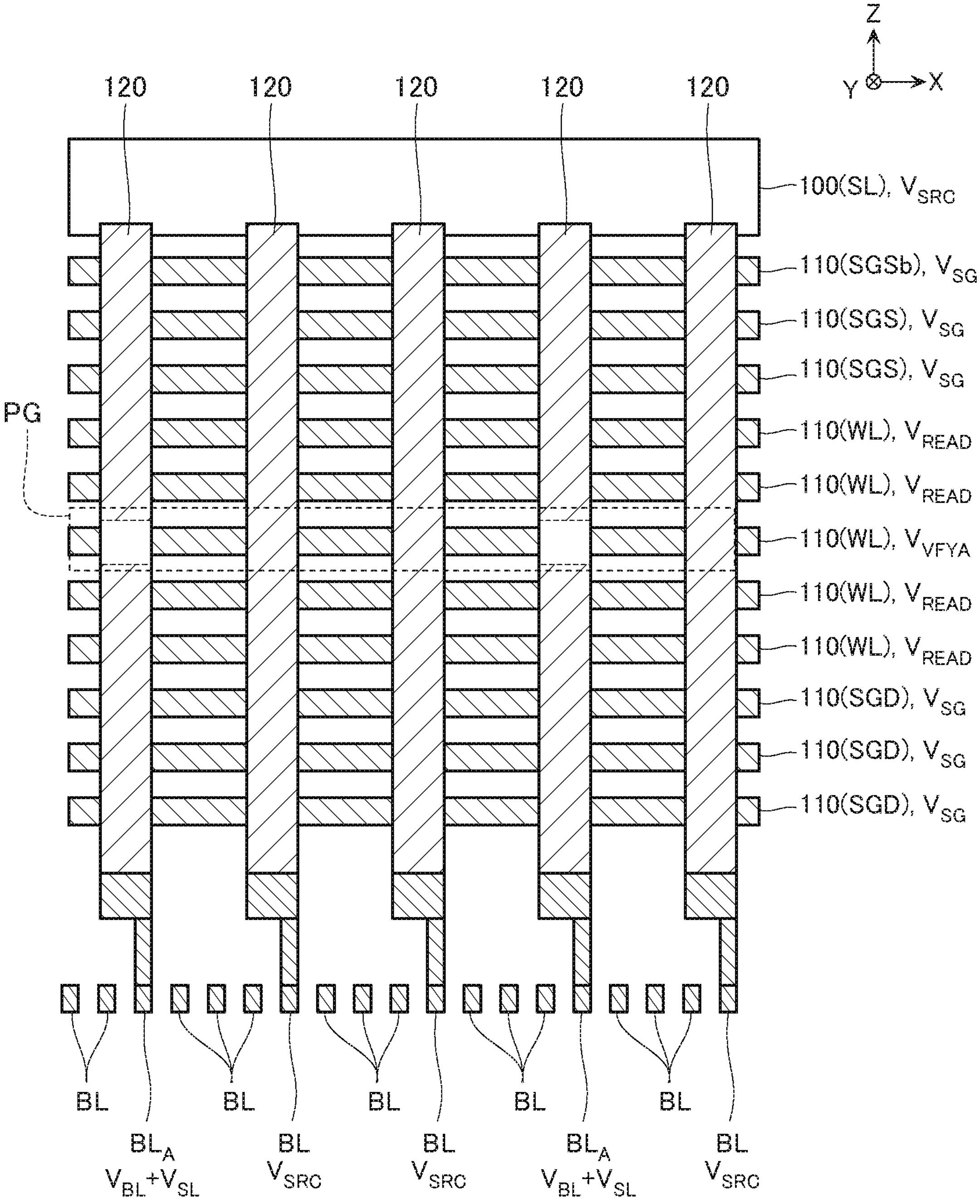
FIG. 17 is a schematic cross-sectional view for explaining a verify operation.
Figure 18:
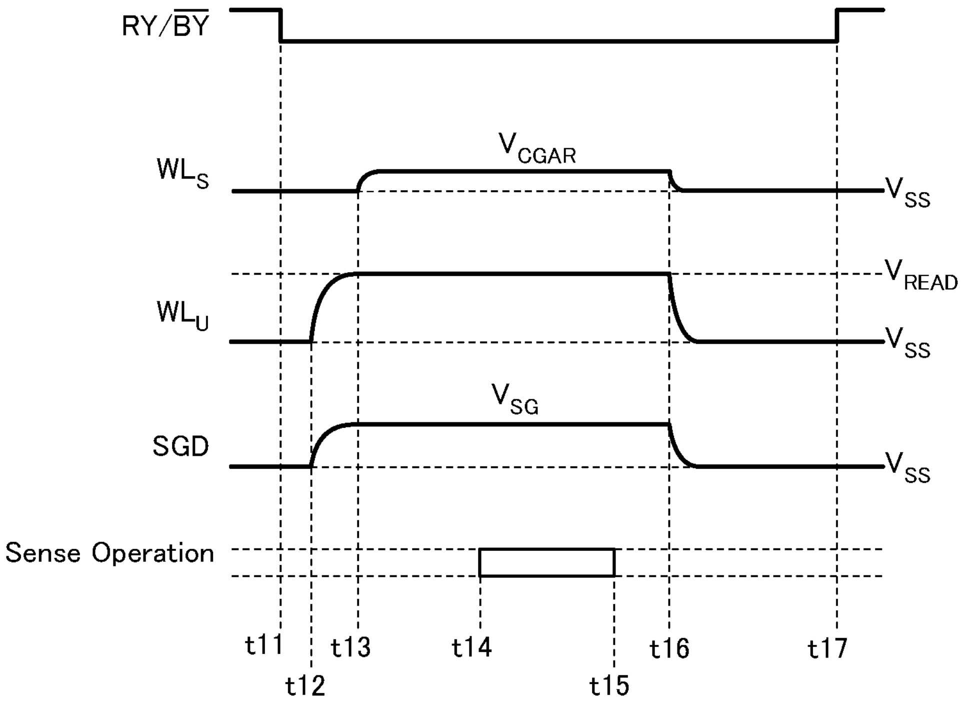
FIG. 18 is a schematic waveform diagram for explaining a read operation of an adjacent memory cell MC.
Figure 19:
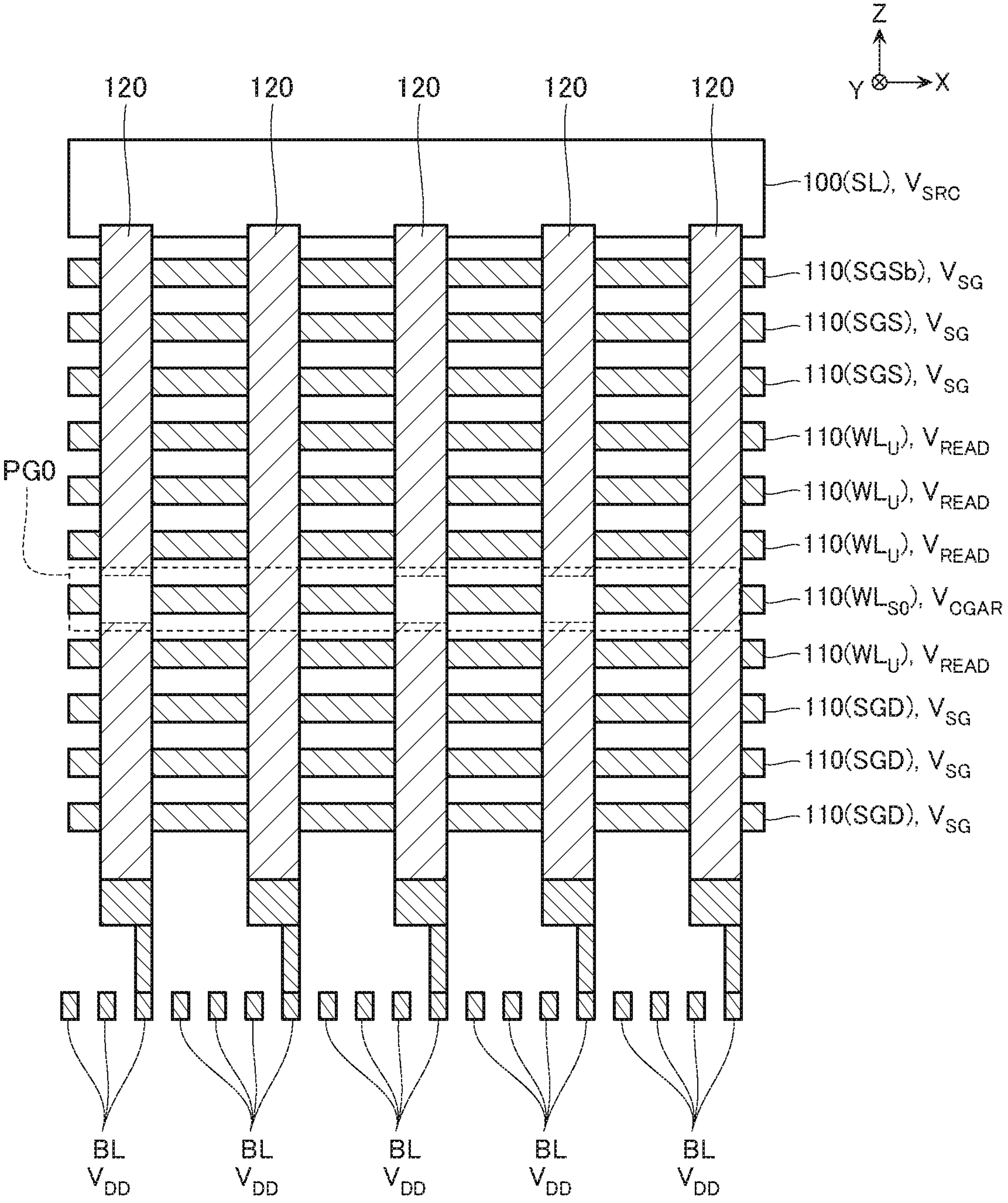
FIG. 19 is a schematic cross-sectional view for explaining the read operation of an adjacent memory cell MC.
Figure 20:
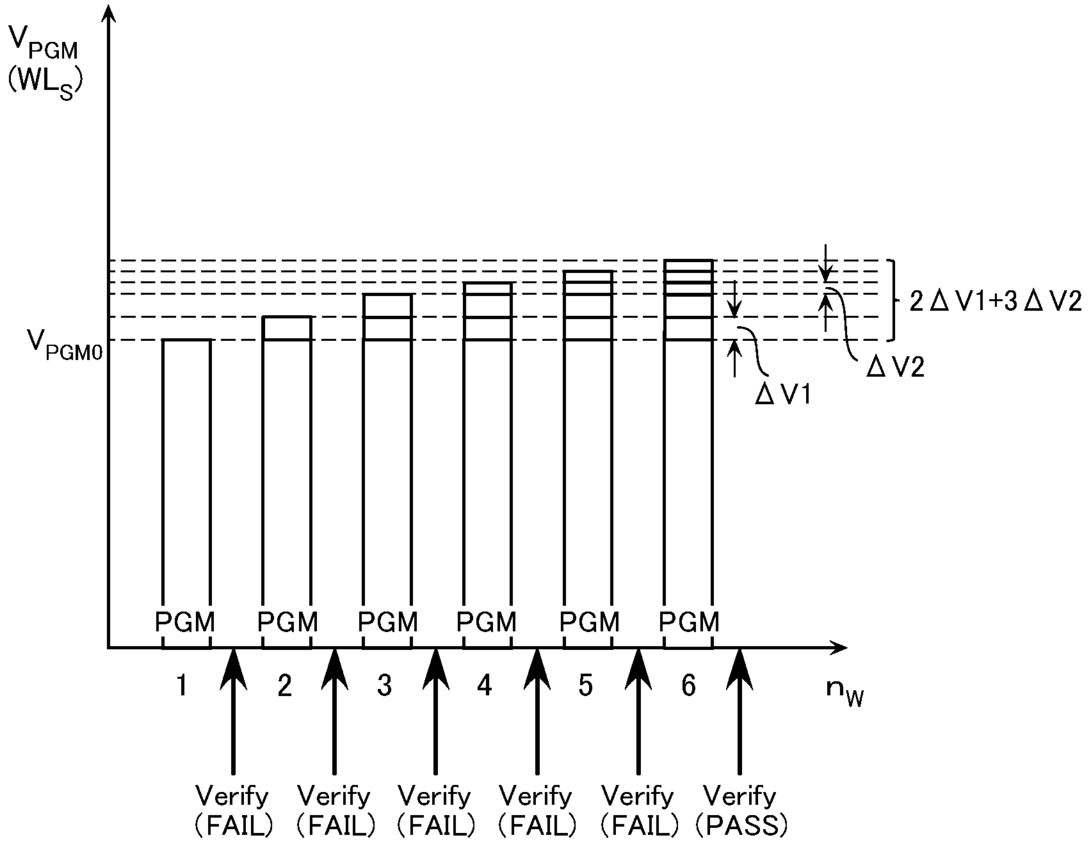
FIG. 20 is a view for explaining a relationship of a loop count $n_W$ and a program voltage $V_{PGM}$.
Figure 21:
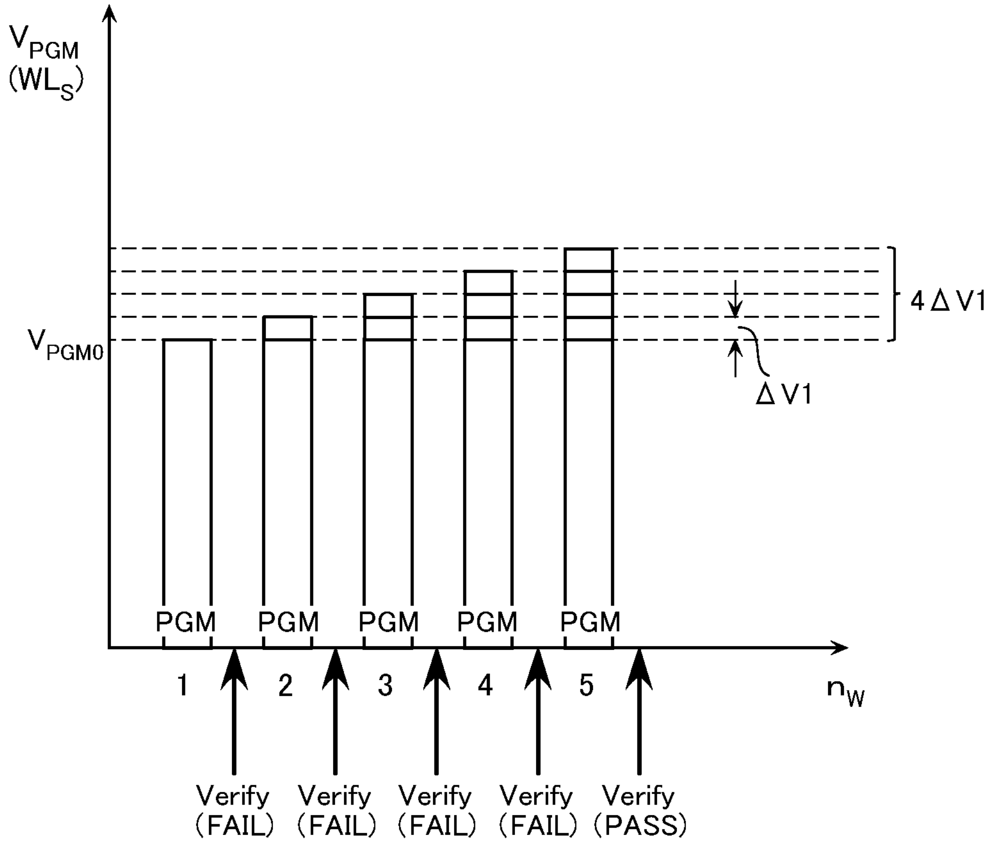
FIG. 21 is a view for explaining the relationship of the loop count $n_W$ and the program voltage $V_{PGM}$.
Figure 22:
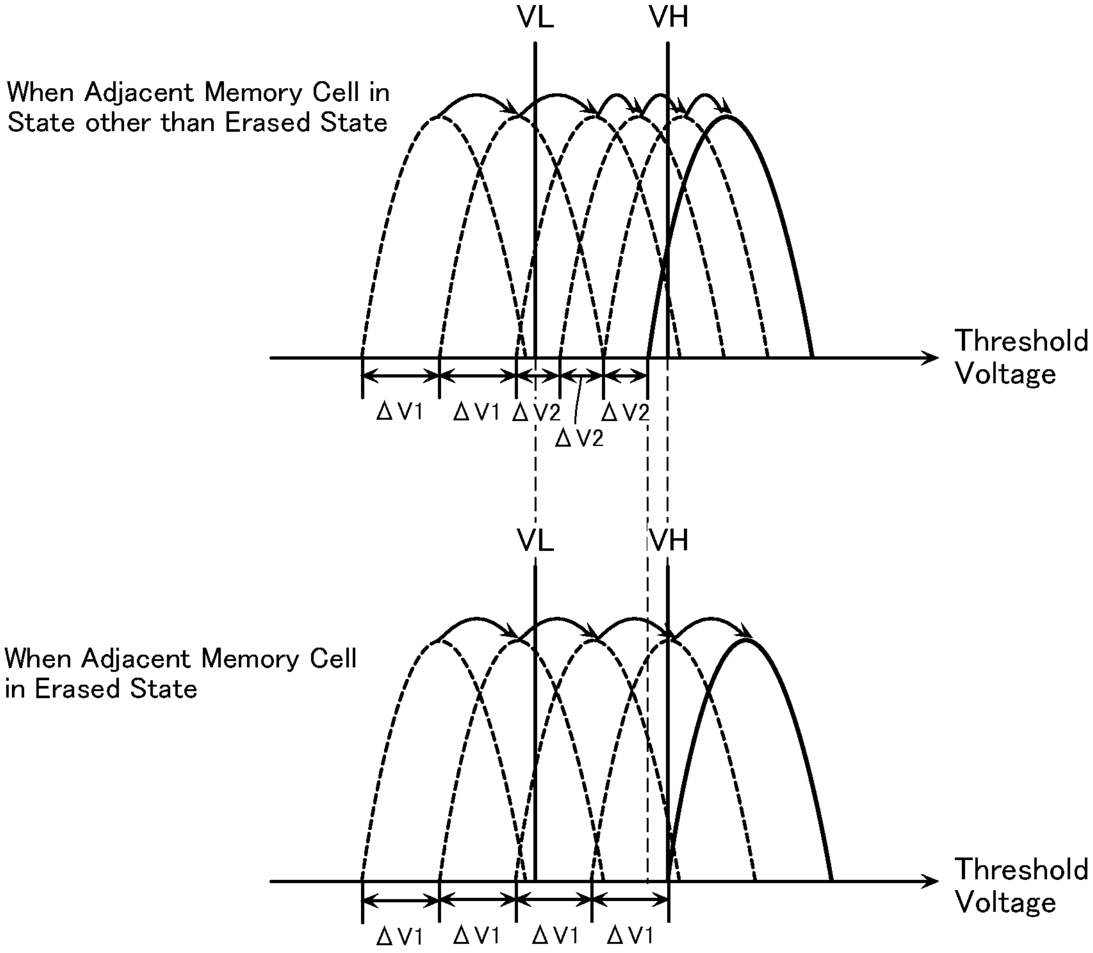
FIG. 22 is a view for explaining the program operation and the verify operation of the first embodiment.

FIG. 14 is a schematic flowchart for explaining the write operation according to the first embodiment. FIG. 15 is a schematic waveform diagram for explaining the write operation according to the first embodiment. FIG. 16 is a schematic cross-sectional view for explaining a program operation. Note that FIG. 16 shows the quick pass write program operation. FIG. 17 is a schematic cross-sectional view for explaining a verify operation. FIG. 18 is a schematic waveform diagram for explaining a read operation of an adjacent memory cell MC. FIG. 19 is a schematic cross-sectional view for explaining the read operation of an adjacent memory cell MC. FIGS. 20 and 21 are views for explaining a relationship of a loop count $n_W$ and a program voltage $V_{PGM}$. FIG. 22 is a view for explaining the program operation and the verify operation of the first embodiment.

At a time of execution of the write operation, a command set to the effect that the write operation is to be executed is inputted from the controller die CD to the memory die MD. This command set includes: the command data $D_{CMD}$ to the effect that the write operation is to be executed; the address data $D_{ADD}$ designating a page PG, the memory block BLK, the memory die MD, and so on, representing a target of the write operation; and the data DAT to be written to the memory cells MC in the page PG. As a result, at timing t201, the terminal RY//BY attains an "L" state (FIG. 15).

In step S101 (FIG. 14), an initial program voltage $V_{PGM0}$ is set (FIGS. 20 and 21). The initial program voltage $V_{PGM0}$ is a voltage of an initial value of the program voltage $V_{PGM}$ in the program operation (step S103).

In step S102, the loop count $n_W$ is set to 1. The loop count $n_W$ is a variable indicating the number of times of write loops. The loop count $n_W$ is stored in a register, or the like. Moreover, in this step S102, data to be stored in a selected memory cell MC in the write operation is latched in the latch circuits ADL-CDL.

In step S103, the program operation is executed. The program operation corresponds to timings t211 to t216 of FIG. 15. In the present embodiment, a normal program operation and the quick pass write (QPW) program operation are provided as the program operation. The normal program operation will sometimes be referred to as a first program operation. The quick pass write program operation will sometimes be referred to as a second program operation.

Now, one of a plurality of selected memory cells MC that is to undergo adjustment of its threshold voltage will sometimes be referred to as a "write memory cell MC". Moreover, one of a plurality of selected memory cells MC that is not to undergo adjustment of its threshold voltage will sometimes be referred to as a "prohibit memory cell MC". Moreover, one of a plurality of write memory cells MC whose threshold voltage has to a certain extent come close to its target value will sometimes be referred to as a "weak write memory cell MC". Moreover, a memory cell adjacent in the Z-direction to a write memory cell MC (including a weak write memory cell MC) will sometimes be referred to as an "adjacent memory cell MC". Moreover, a word line WL adjacent in the Z-direction to a selected word line $WL_S$ will sometimes be referred to as an "adjacent word line WL".

Basically, the quick pass write (QPW) program operation is executed on a weak write memory cell MC. Moreover, the normal program operation is executed on a write memory cell MC which is not a weak write memory cell MC. However, in the present embodiment, the normal program operation will be executed even on a weak write memory cell MC when in later-mentioned step S112, an adjacent memory cell MC adjacent in the Z-direction to the weak write memory cell MC has been judged to be in an erased state (the state controlled to the Er state in FIGS. 12A and 12B).

At timing t211 (FIG. 15) of the program operation, for example, a bit line $BL_W$ connected to the write memory cell MC of the plurality of selected memory cells MC is applied with the voltage $V_{SRC}$, and a bit line $BL_P$ connected to the prohibit memory cell MC of the plurality of selected memory cells MC is applied with the voltage $V_{DD}$. For example, the latch circuit SDL (FIG. 7) corresponding to the bit line $BL_W$ is latched with "L", and the latch circuit SDL (FIG. 7) corresponding to the bit line $BL_P$ is latched with "H". Moreover, states of the signal lines STB, XXL, BLC, BLS, HLL, BLX are set to "L, L, H, H, L, H".

At timing t212 (FIG. 15) of the program operation, the write memory cell MC is selectively made electrically continuous with the bit line $BL_W$. For example, the drain side select gate line SGD is applied with a voltage $V_{SGD}$. As a result, the drain side select transistor STD corresponding to the bit line $BL_W$ applied with the voltage $V_{SRC}$ attains an ON state, and the drain side select transistor STD corresponding to the bit line $BL_P$ applied with the voltage $V_{DD}$ attains an OFF state.

Moreover, at timing t212 of the program operation, the selected word line $WL_S$ and an unselected word line $WL_U$ are applied with a write pass voltage $V_{PASS}$, whereby all of the memory cells MC are set to an ON state. The write pass voltage $V_{PASS}$ is larger than the read pass voltage $V_{READ}$ of FIG. 12A, for example.

Note that at timings t211 to t212, the quick pass write program operation and the normal program operation are both the same operation.

At timing t213 of the program operation, when the adjacent memory cell MC has been judged not to be in the erased state in the later-mentioned step S112 and the write memory cell MC is a weak write memory cell MC, the quick pass write (QPW) program operation is executed.

The quick pass write program operation is executed as follows. A bit line $BL_{QPW}$ connected to the weak write memory cell MC is applied with a voltage $V_{QPW}$. For example, a gate voltage of the clamp transistor 44 of FIG. 7 is priorly adjusted at a timing earlier than timing t213. At this time, the bit line $BL_W$ is being applied with the voltage $V_{SRC}$ via the discharge transistor 50, so voltage of the bit line $BL_W$ does not change. Moreover, the bit line $BL_P$ is isolated from the sense amplifier SA (FIG. 7) by the clamp transistor 44. Next, at timing t213, data latched in the latch circuit SDL (FIG. 7) corresponding to the bit line $BL_{QPW}$ is switched from "L" to "H". As a result, the node COM (FIG. 7) of the sense amplifier SA corresponding to the weak write memory cell MC switches from the voltage $V_{SRC}$ to the voltage $V_{DD}$. Moreover, voltage of the bit line BL corresponding to this sense amplifier SA, which is clamped by the clamp transistor 44, switches from the voltage $V_{SRC}$ to the voltage $V_{QPW}$. The voltage $V_{QPW}$ is a voltage larger than the voltage $V_{SRC}$, but smaller than the voltage $V_{DD}$.

On the other hand, at timing t213 of the program operation, when the write memory cell MC is not a weak write memory cell MC, moreover, when the adjacent memory cell MC has been judged to be in the erased state in the later-mentioned step S112, the normal program operation is executed.

In the normal program operation, the bit line $BL_W$ connected to the write memory cell MC and the bit line $BL_{QPW}$ connected to the weak write memory cell MC are applied with the voltage $V_{SRC}$ (that is, are maintained unchanged at the voltage $V_{SRC}$).

At timing t214 (FIG. 15) of the program operation, the selected word line $WL_S$ is applied with a program voltage $V_{PGM}$. The program voltage $V_{PGM}$ is larger than the write pass voltage $V_{PASS}$.

Now, as shown in FIG. 16, for example, in the normal program operation, the channel of the semiconductor layer 120 connected to the bit line $BL_W$ is applied with the voltage $V_{SRC}$. A comparatively large electric field is generated between such a semiconductor layer 120 and the selected word line $WL_S$. As a result, electrons in the channel of the semiconductor layer 120 tunnel into the electric charge accumulating film 132 (FIG. 11) via the tunnel insulating film 131 (FIG. 11). Hence, in the normal program operation, there is a comparatively large increase in a threshold voltage of the write memory cell MC.

Moreover, in the quick pass write program operation, the channel of the semiconductor layer 120 connected to the bit line $BL_{QPW}$ is applied with the voltage $V_{QPW}$. An electric field smaller than the above-described electric field is generated between such a semiconductor layer 120 and the selected word line $WL_S$. As a result, electrons in the channel of the semiconductor layer 120 tunnel into the electric charge accumulating film 132 (FIG. 11) via the tunnel insulating film 131 (FIG. 11). Hence, in the quick pass write program operation, there is a comparatively small increase in a threshold voltage of the weak write memory cell MC.

Moreover, in the normal program operation, the channel of the semiconductor layer 120 connected to the bit line $BL_{QPW}$ is applied with the voltage $V_{SRC}$. A comparatively large electric field is generated between such a semiconductor layer 120 and the selected word line $WL_S$. As a result, electrons in the channel of the semiconductor layer 120 tunnel into the electric charge accumulating film 132 (FIG. 11) via the tunnel insulating film 131 (FIG. 11). Hence, in the normal program operation, there is a comparatively large increase in the threshold voltage of the weak write memory cell MC.

Moreover, the channel of the semiconductor layer 120 connected to the bit line $BL_P$ is in an electrically floating state, and a potential of this channel rises to about the write pass voltage $V_{PASS}$ due to capacitive coupling with the unselected word line $WL_U$. Only an electric field smaller than any of the above-described electric fields is generated between such a semiconductor layer 120 and the selected word line $WL_S$. Hence, electrons in the channel of the semiconductor layer 120 do not tunnel into the electric charge accumulating film 132 (FIG. 11). Consequently, there is no increase in a threshold voltage of the prohibit memory cell MC.

At timing t215 of the program operation, the selected word line $WL_S$ and the unselected word line $WL_U$ are applied with the write pass voltage $V_{PASS}$, whereby all of the memory cells MC are set to an ON state.

At timing t216 of the program operation, the selected word line $WL_S$, the unselected word line $WL_U$, and the select gate lines (SGD, SGS, SGSb) are applied with the ground voltage $V_{SS}$.

Note that at timings t215 to t216, the quick pass write program operation and the normal program operation are both the same operation.

In steps S104 to S108 (FIG. 14), the verify operation is executed.

At timing t221 of the verify operation, as shown in FIG. 15, for example, the selected word line $WL_S$ and the unselected word line $WL_U$ are applied with the read pass voltage $V_{READ}$, whereby all of the memory cells MC are set to an ON state. Moreover, the select gate lines (SGD, SGS, SGSb) are applied with a voltage $V_{SG}$, whereby the select transistors (STD, STS, STSb) are set to an ON state. The voltage $V_{SG}$ is larger than the voltage $V_{SGD}$, for example.

In step S104 (FIG. 14), an initial level of verify voltage to be applied to the selected word line $WL_S$ is set.

For example, at timing t222 of the verify operation, the selected word line $WL_S$ is applied with the initial level of verify voltage ($V_{VFYA}$ in the example of FIG. 15). As a result, as shown in FIG. 17, for example, a part of the selected memory cells MC attain an ON state, and the remainder of the selected memory cells MC attain an OFF state.

Next, in step S105 (FIG. 14), verify is executed at a sense level VL a little lower than a normal sense level VH, with respect to level $V_{VFYA}$ of the verify voltage. Subsequently, in step S106 (FIG. 14), verification is executed at the normal sense level VH with respect to level $V_{VFYA}$ of the verify voltage. In this way, two times of the verification, that is, the verification at the sense level VL a little lower than the normal sense level VH and the verify at the normal sense level VH are executed with respect to the single level $V_{VFYA}$ of the verify voltage.

For example, at timing t222, charging of the bit lines BL, and so on, is performed. At this time, for example, a bit line BL (the bit line $BL_A$ in the example of FIG. 15) connected to the memory cell MC corresponding to a specific state (the A state in the example of FIG. 15) is applied with a voltage $V_{BL}+V_{SL}$, and other bit lines BL are applied with the voltages $V_{SRC}$ (FIG. 17), based on data in the latch circuits ADL-CDL.

At timings t223 to t224 (FIG. 15) of the verify operation, the first time of the verification is executed at the sense level VL a little lower than the normal sense level VH, with respect to level $V_{VFYA}$ of the verify voltage. As shown in FIG. 15, for example, ON state/OFF state of the memory cell MC connected to the bit line $BL_A$ is detected, and data indicating the state of this memory cell MC acquired by the sense amplifier module SAM (FIG. 6). At this time, the latch circuits ADL to CDL are latched with data indicating the ON state/OFF state of the memory cell MC, and so on.

At timings t225 to t226 (FIG. 15) of the verify operation, the second time of the verification is executed at the normal sense level VH, with respect to level $V_{VFYA}$ of the verify voltage. As shown in FIG. 15, for example, ON state/OFF state of the memory cell MC connected to the bit line $BL_A$ is detected, and data indicating the state of this memory cell MC acquired by the sense amplifier module SAM (FIG. 6). At this time, the latch circuits ADL to CDL are latched with data indicating the ON state/OFF state of the memory cell MC, and so on.

Time t1 between timing t223 and timing t224 is shorter than time t2 between timing t225 and timing t226. Hence, charge discharged from the sense node SEN (FIG. 7) at timings t223 to t224 is less than charge discharged from the sense node SEN (FIG. 7) at timings t225 to t226. Thus, in the two times of verifies, the level $V_{VFYA}$ of verify voltage applied to the selected word line $WL_S$ is the same. However, due to sense times in the two times of verifies differing, it appears as though the verify at the sense level VL a little lower than the normal sense level VH and the verify at the normal sense level VH have actually been performed with respect to level $V_{VFYA}$ of the verify voltage, that is, there is a pseudo-execution of the two times of verifies with respect to level $V_{VFYA}$ of the verify voltage.

For example, there is a high possibility that a threshold voltage of a memory cell MC that has been judged to be in an OFF state by data detected between timing t225 and timing t226 (data detected in the second time of verify), has reached its target value. At least a part of such memory cells MC will be regarded as prohibit memory cells MC in the next time of write loop onward.

Moreover, for example, there is a high possibility that threshold voltage of a memory cell MC that has been judged to be in an ON state by data detected between timing t225 and timing t226 (data detected in the second time of verify) and has been judged to be in an OFF state by data detected between timing t223 and timing t224 (data detected in the first time of verify), has to a certain extent come close to its target value. At least a part of such memory cells MC will be regarded as weak write memory cells MC in the next time of write loop. In this case, as mentioned above, when the adjacent memory cell MC adjacent to the weak write memory cell MC is not in the erased state, the quick pass write program operation will be executed. On the other hand, when the adjacent memory cell MC adjacent to the weak write memory cell MC is in the erased state, the normal program operation will be executed.

Moreover, for example, there is a high possibility that a threshold voltage of a memory cell MC that has been judged to be in an ON state by data detected between timing t223 and timing t224, is to a certain extent distant from its target value. At least a part of such memory cells MC will be regarded as write memory cells MC in the next time of write loop.

As explained with reference to above-described FIG. 13, the latch circuit TDL is latched with QPW data indicating whether the quick pass write (QPW) program operation is to be executed, or not. For example, QPW data "1" is set in the latch circuit TDL corresponding to the bit line $BL_P$ connected to the prohibit memory cell MC. Moreover, QPW data "1" is set in the latch circuit TDL corresponding to the bit line $BL_{QPW}$ connected to the weak write memory cell MC. Moreover, QPW data "0" is set in the latch circuit TDL corresponding to the bit line $BL_W$ connected to the write memory cell MC which is not a weak write memory cell MC.

It is decided whether the quick pass write program operation is to be executed or not, in the program operation (step S103) of the next time of write loop, based on the likes of data indicating the ON state/OFF state of the memory cell MC latched in the latch circuits ADL to CDL and on the QPW data latched in the latch circuit TDL.

In step S107 (FIG. 14), it is judged whether the verify voltage is at its final level or not. When the verify voltage is not at its final level (NO in step S107), in step S108, the next level of verify voltage is set.

For example, at timing t227 of the verify operation, the verify voltage is not at its final level (NO in step S107), so the next level $V_{VFYB}$ of verify voltage is applied (step S108). At timings t227 to t231 of the verify operation, a memory cell MC in another state (the B state in the example of FIG. 15) undergoes similar processing to at timings t222 to t226. Note that in FIG. 15, the bit line BL connected to the memory cell MC corresponding to the B state is denoted as bit line $BL_B$.

Moreover, for example, at timing t232 of the verify operation, the verify voltage is not at its final level (NO in step S107), so the next level $V_{VFYC}$ of verify voltage is applied (step S108). At timings t232 to t236 of the verify operation, a memory cell MC in another state (the C state in the example of FIG. 15) undergoes similar processing to at timings t222 to t226. Note that in FIG. 15, the bit line BL connected to the memory cell MC corresponding to the C state is denoted as bit line $BL_C$.

Moreover, for example, at timing t237 of the verify operation, the verify voltage is at its final level (YES in step S107), so the selected word line $WL_S$ and the unselected word line $WL_U$ are applied with the read pass voltage $V_{READ}$, whereby all of the memory cells MC are set to an ON state. Moreover, the select gate lines (SGD, SGS, SGSb) are applied with the voltage $V_{SG}$, whereby the select transistors (STD, STS, STSb) are set to an ON state.

At timing t238 of the verify operation, the selected word line $WL_S$, the unselected word line $WL_U$, and the select gate lines (SGD, SGS, SGSb) are applied with the ground voltage $V_{SS}$.

Subsequently, data latched in the latch circuit SDL is transferred to an unillustrated counter circuit, whereby the number of memory cells MC whose threshold voltages have reached their target value or number of memory cells MC whose threshold voltages have not reached their target value, are counted.

Note that the example of FIG. 15 showed an example of the selected word line $WL_S$ being applied with three types of level $V_{VFY}$ of the verify voltage ($V_{VFYA}$, $V_{VFYB}$, $V_{VFYC}$) in the verify operation. However, the number of types of level $V_{VFY}$ of the verify voltage applied to the selected word line $WL_S$ in the verify operation may be two or less, may be four or more, or may change according to the loop count $n_W$.

In step S109 (FIG. 14), a result of the verify operation is judged. For example, reference is made to the above-described counter circuit, and in such cases as when the number of memory cells MC whose threshold voltages have not reached their target value is a fixed number or more, it is judged to be a verify FAIL, and processing proceeds to step S110. On the other hand, in such cases as when the number of memory cells MC whose threshold voltages have not reached their target value is a fixed number or less, it is judged to be a verify PASS, and processing proceeds to step S115.

In step S110, it is judged whether the loop count $n_W$ has reached a certain frequency $N_W$ or not. When frequency $N_W$ has not been reached, processing proceeds to step S111. When frequency $N_W$ has been reached, processing proceeds to step S116.

In step S111, 1 is added to the loop count $n_W$, and processing proceeds to step S112. In step S112, a read operation of data of the adjacent memory cell MC is executed.

This read operation is an operation that reads data of a plurality of selected memory cells MC corresponding to a selected page PG and thereby discriminates whether the data of the plurality of selected memory cells MC is in the erased state, or not. A selected word line $WL_{S0}$ corresponding to a selected page PG0 in FIGS. 18 and 19 is the word line WL (adjacent word line WL) adjacent on a negative side in the Z-direction to the selected word line $WL_S$ connected to the selected page PG in FIGS. 16 and 17. The read operation is started at timing t11 of FIG. 18, for example.

In the read operation, as shown in FIG. 19, for example, the plurality of bit lines BL included in the string unit SU representing a target of the operation are applied with the voltage $V_{DD}$. Moreover, the source line SL is applied with the voltage $V_{SRC}$.

Moreover, in the read operation, as shown in FIGS. 18 and 19, for example, in a period from timing t12 to timing t16, the drain side select gate line SGD is applied with the voltage $V_{SG}$. The channel region of the drain side select transistor STD has a channel of electrons formed therein, and has the voltage $V_{DD}$ transferred thereto.

Moreover, in the read operation, as shown in FIG. 19, for example, the source side select gate lines SGS, SGSb are applied with the voltage $V_{SG}$. The channel regions of the source side select transistors STS, STSb have a channel of electrons formed therein, and have the voltage $V_{SRC}$ transferred thereto.

Moreover, in the read operation, as shown in FIGS. 18 and 19, for example, in the period from timing t12 to timing t16, the unselected word line $WL_U$ is applied with the read pass voltage $V_{READ}$. The read pass voltage $V_{READ}$ is larger than the voltages $V_{DD}$, $V_{SRC}$. Moreover, a voltage difference between the read pass voltage $V_{READ}$ and the voltages $V_{DD}$, $V_{SRC}$ is larger than the threshold voltage when the memory cell MC is operated as an NMOS transistor, regardless of data stored in the memory cell MC. Hence, the channel regions of unselected memory cells MC have a channel of electrons formed therein, and the selected memory cells MC have the voltages $V_{DD}$, $V_{SRC}$ transferred thereto.

Moreover, in the read operation, as shown in FIGS. 18 and 19, for example, in a period from timing t13 to timing t16, the selected word line $WL_{S0}$ is applied with a read voltage $V_{CGR}$. The read voltage $V_{CGR}$ is smaller than the read pass voltage $V_{READ}$. In the present embodiment, as shown in FIGS. 18 and 19, the read voltage $V_{CGR}$ is adopted as the read voltage $V_{CGAR}$ corresponding to the A state. A voltage difference between the read voltage $V_{CGAR}$ and the voltage $V_{SRC}$ is larger than the threshold voltage of the memory cell MC in the Er state. Hence, the memory cell MC in the Er state attains an ON state. Hence, current flows in the bit line BL connected to such a memory cell MC. On the other hand, the voltage difference between the read voltage $V_{CGAR}$ and the voltage $V_{SRC}$ is smaller than the threshold voltage of a memory cell MC in the A state to the G state. Hence, a memory cell MC in the A state to the G state attains an OFF state. Hence, current does not flow in the bit line BL connected to such a memory cell MC.

Moreover, in the read operation, the sense amplifier module SAM (FIG. 6) is used to detect whether current is flowing in the bit line BL or not, and thereby detect the ON state/OFF state of the memory cell MC.

In the example of FIG. 18, the sense amplifier SA performs a sense operation on the bit line BL in a period from timing t14 to timing t15.

For example, when the selected memory cell MC (adjacent memory cell MC) corresponding to one bit line BL is in an ON state, it indicates that the selected word line $WL_{S0}$ (adjacent word line WL) connected to that selected memory cell MC is in the erased state (the state controlled to the Er state). In this case, for example, data of "1" is stored in the latch circuit SDL corresponding to that bit line BL.

Moreover, for example, when the selected memory cell MC (adjacent memory cell MC) corresponding to one bit line BL is in an OFF state, it indicates that the selected word line $WL_{S0}$ (adjacent word line WL) connected to that selected memory cell MC is not in the erased state (the state controlled to the Er state). In this case, for example, data of "0" is stored in the latch circuit SDL corresponding to that bit line BL.

In step S113 (FIG. 14), when the adjacent memory cell MC is in the erased state (data stored in the latch circuit SDL is "1") and data stored in the latch circuit TDL is "1", the data stored in the latch circuit TDL is adjusted from "1" to "0". Due to the data stored in the latch circuit TDL being adjusted from "1" to "0" in this way, the normal program operation will be executed on the weak write memory cell MC in the program operation (step S103) of the next time of write loop. Note that when the adjacent memory cell MC is not in the erased state (when data stored in the latch circuit SDL is "0") or when data stored in the latch circuit TDL is "0", the data stored in the latch circuit TDL is not adjusted.

In step S114, for example, a certain offset voltage ΔV is added to the program voltage $V_{PGM}$. Hence, the program voltage $V_{PGM}$ increases along with increase in the loop count $n_W$. Subsequently, processing proceeds to step S103.

FIG. 20 shows an example of the program operation in the write loop being executed six times in the case where the adjacent memory cell MC is not in the erased state. In the program operation in the first time of write loop (loop count $n_W$=1), the selected word line $WL_S$ is applied with the initial program voltage $V_{PGM0}$. Moreover, in the program operation in the second time of write loop (loop count $n_W$=2), the selected word line $WL_S$ is applied with a voltage being the initial program voltage $V_{PGM0}$ to which an offset voltage ΔV1 has been added ($V_{PGM0}$+ΔV1), as the program voltage $V_{PGM}$. Now, the offset voltage ΔV1 is an offset voltage added during execution of the normal program operation.

In the program operation in the third time of write loop (loop count $n_W$=3), the selected word line $WL_S$ is applied with a voltage being the program voltage of the program operation in the second time of write loop ($V_{PGM0}$+ΔV1) to which the offset voltage ΔV1 has been added ($V_{PGM0}$+2ΔV1), as the program voltage $V_{PGM}$. As shown in an upper portion of FIG. 22, a greater part of the threshold distribution of the write memory cell MC exceeds level VL of the verify voltage. In this case, there is a state where the threshold voltage of the write memory cell MC has to a certain extent come close to its target value (sense level VH).

In the program operation in the fourth time of write loop (loop count $n_W$=4), the selected word line $WL_S$ is applied with a voltage being the program voltage of the program operation in the third time of write loop ($V_{PGM0}$+2ΔV1) to which an offset voltage ΔV2 has been added ($V_{PGM0}$+2ΔV1+ΔV2), as the program voltage $V_{PGM}$. Now, the offset voltage ΔV2 is an offset voltage added during execution of the quick pass write program operation. As mentioned above, in the normal program operation, the increase in a threshold voltage of the write memory cell MC is comparatively large, and in the quick pass write program operation, the increase in a threshold voltage of the write memory cell MC is comparatively small. Hence, the offset voltage ΔV2 is of smaller width than the offset voltage ΔV1. Thus, in the quick pass write program operation, write is performed with a smaller width than in the normal program operation.

In the program operations in the fifth and sixth times of write loops (loop count $n_W$=5, 6), the selected word line $WL_S$ is respectively applied with a voltage ($V_{PGM0}$+2ΔV1+2ΔV2) and voltage ($V_{PGM0}$+2ΔV1+3ΔV2), as the program voltage $V_{PGM}$. As shown in the upper portion of FIG. 22, a greater part of the threshold distribution of the write memory cell MC (weak write memory cell MC) exceeds sense level VH. In this case, verify PASS is attained in judgement of result of the verify operation (step S109).

FIG. 21 shows an example of the program operation in the write loop being executed five times in the case where the adjacent memory cell MC is in the erased state. The program operations in the first to third times of write loops (loop count $n_W$=1 to 3) are similar in content to those described with reference to FIG. 20. As shown in a lower portion of FIG. 22, a greater part of the threshold distribution of the write memory cell MC exceeds level VL of the verify voltage. In this case, there is a state where the threshold voltage of the write memory cell MC has to a certain extent come close to its target value (sense level VH). Hence, in principle, the quick pass write program operation will be executed in the program operation of the next time of write loop onwards. However, as mentioned above, when the adjacent memory cell MC is in the erased state (when data of the latch circuit TDL has been adjusted from "1" to "0" in step S113 of FIG. 14), the quick pass write program operation is not executed, rather, the normal program operation is executed.

Hence, in the program operation in the fourth time of write loop (loop count $n_W$=4), the selected word line $WL_S$ is applied with a voltage being the program voltage of the program operation in the third time of write loop ($V_{PGM0}$+2ΔV1) to which the offset voltage ΔV1 has been added ($V_{PGM0}$+3ΔV1), as the program voltage $V_{PGM}$.

In the program operation in the fifth time of write loop (loop count $n_W$=5), the selected word line $WL_S$ is applied with a voltage ($V_{PGM0}$+4ΔV1), as the program voltage $V_{PGM}$. As shown in the lower portion of FIG. 22, a greater part of the threshold distribution of the write memory cell MC exceeds sense level VH. In this case, verify PASS is attained in judgement of result of the verify operation (step S109).

The threshold distribution of the write memory cell MC in the lower portion of FIG. 22 is written with a larger width than the threshold distribution of the write memory cell MC in the upper portion of FIG. 22. Hence, the threshold distribution of the write memory cell MC in the lower portion of FIG. 22 has a larger threshold voltage than the threshold distribution of the write memory cell MC in the upper portion of FIG. 22.

[Order of Execution of Write Operation]

Figure 23:
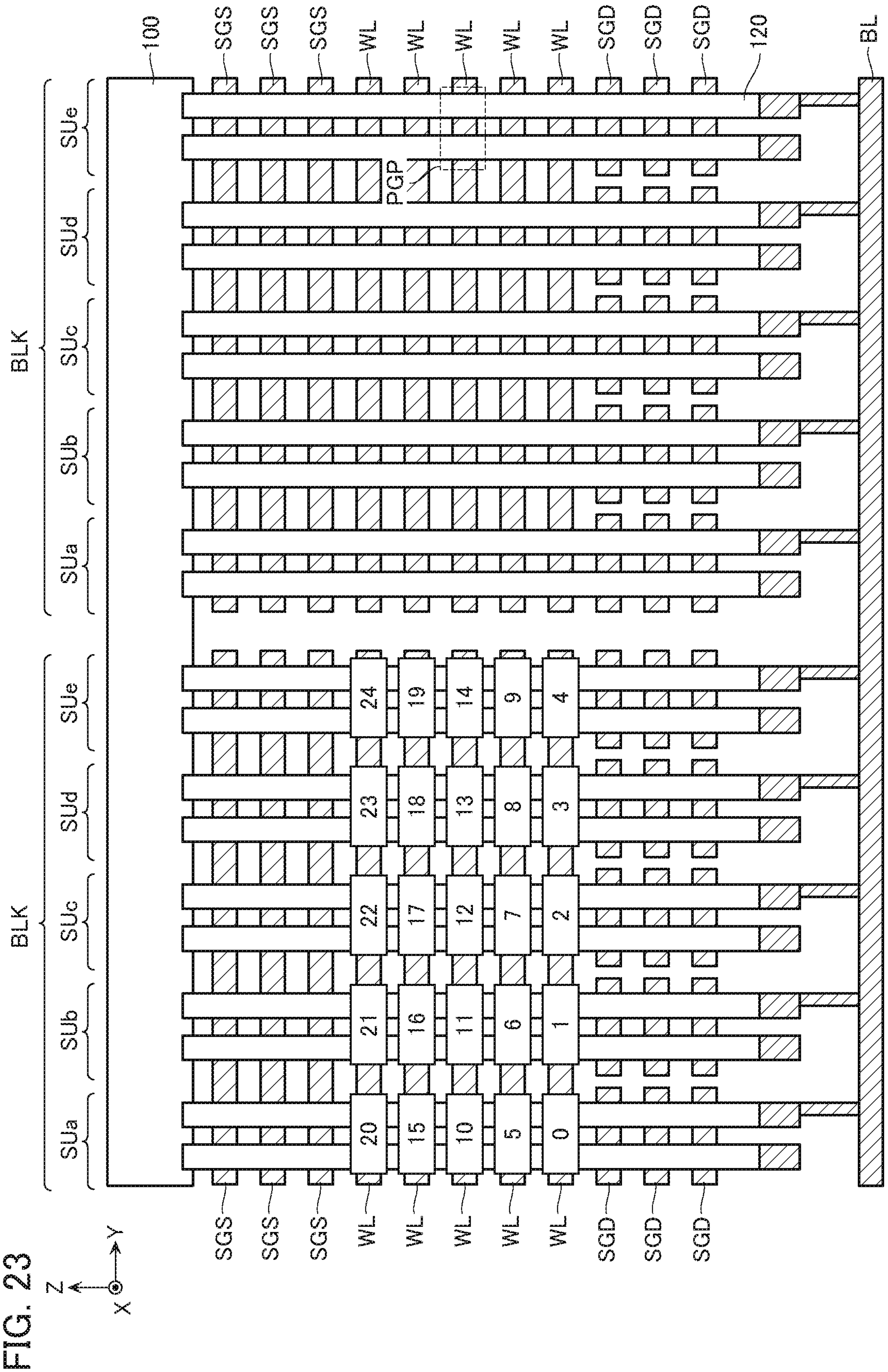
FIG. 23 is a schematic cross-sectional view for explaining order of execution of the write operation of the first embodiment.

FIG. 23 is a schematic cross-sectional view for explaining order of execution of the write operation of the first embodiment. In FIG. 23, two memory blocks BLK are exemplified. Moreover, in the example of FIG. 23, the memory block BLK comprises five word lines WL and five string units SUa-SUe. Hence, in the example of FIG. 23, the memory block BLK comprises 25 page-portions PGP. The page-portion PGP comprises a plurality of the pages PG.

Moreover, in FIG. 23, the order of execution of the write operation is exemplified. In the example of FIG. 23, first, the write operation is sequentially executed on the five page-portions PGP corresponding to the first word line WL counting from below. Next, the write operation is sequentially executed on the five page-portions PGP corresponding to the second word line WL counting from below. Likewise, thereafter, the write operation is sequentially executed on the 15 page-portions PGP corresponding to the third to fifth word lines WL counting from below.

[Advantages]

Figure 24:
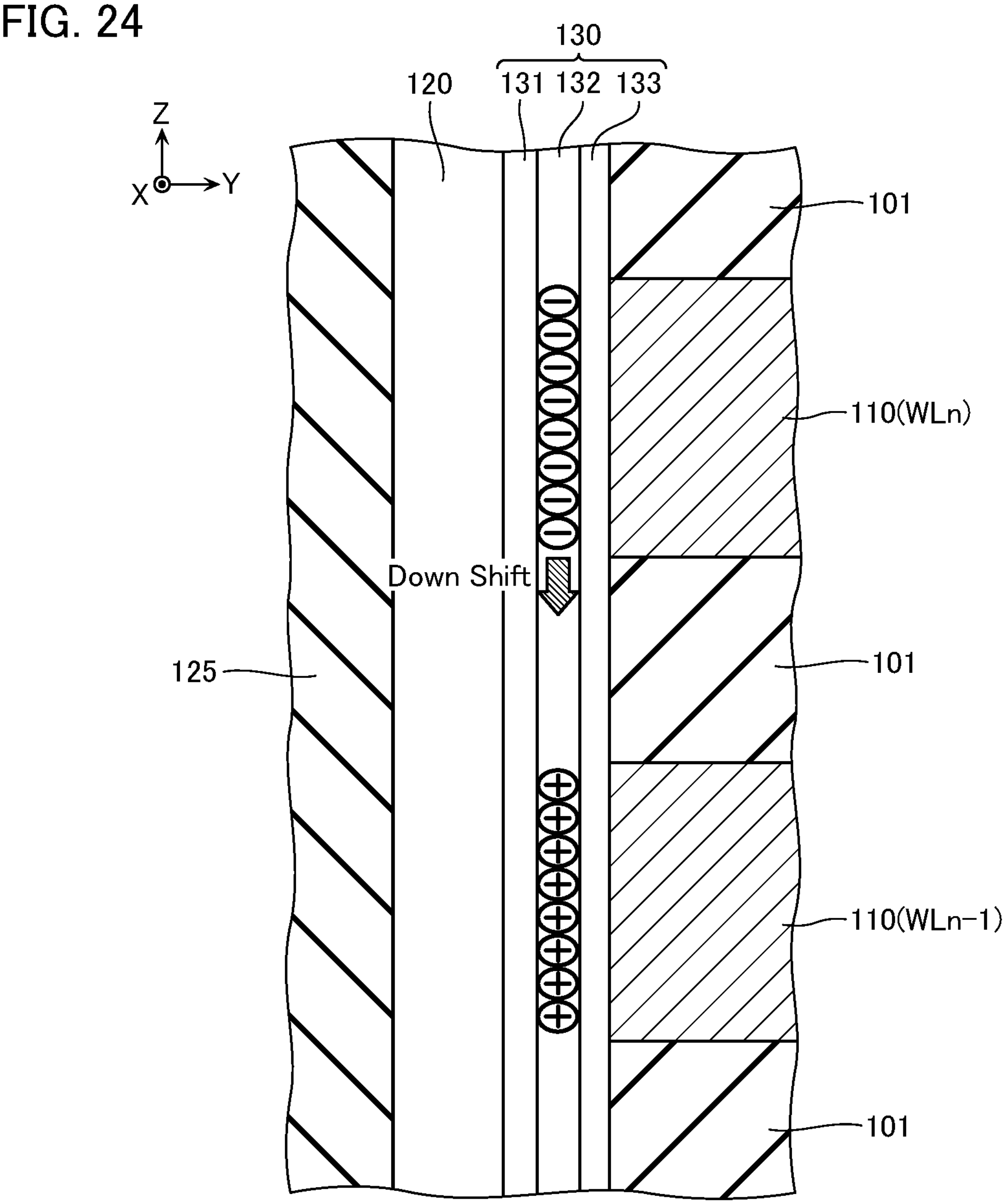
FIG. 24 is a schematic cross-sectional view showing states of carriers after the write operation of the first embodiment.

When the write operation is executed in the order described with reference to FIG. 23, the adjacent memory cell MC adjacent to any of the memory cells MC corresponding to the second word line WL counting from below is in the erased state, for example, the threshold voltage of that one of the memory cells MC corresponding to the second word line WL counting from below will sometimes be down-shifted. Conceivably, the cause of this is that when, for example, two conductive layers 110 (word lines WLn−1, WLn) arranged in the Z-direction are supposed as in FIG. 24, apply of the program voltage $V_{PGM}$ to the upwardly-provided conductive layer 110 (word line WLn) will cause electrons to shift to a near vicinity of the downwardly-provided conductive layer 110 (word line WLn−1), and so on.

Figure 25:
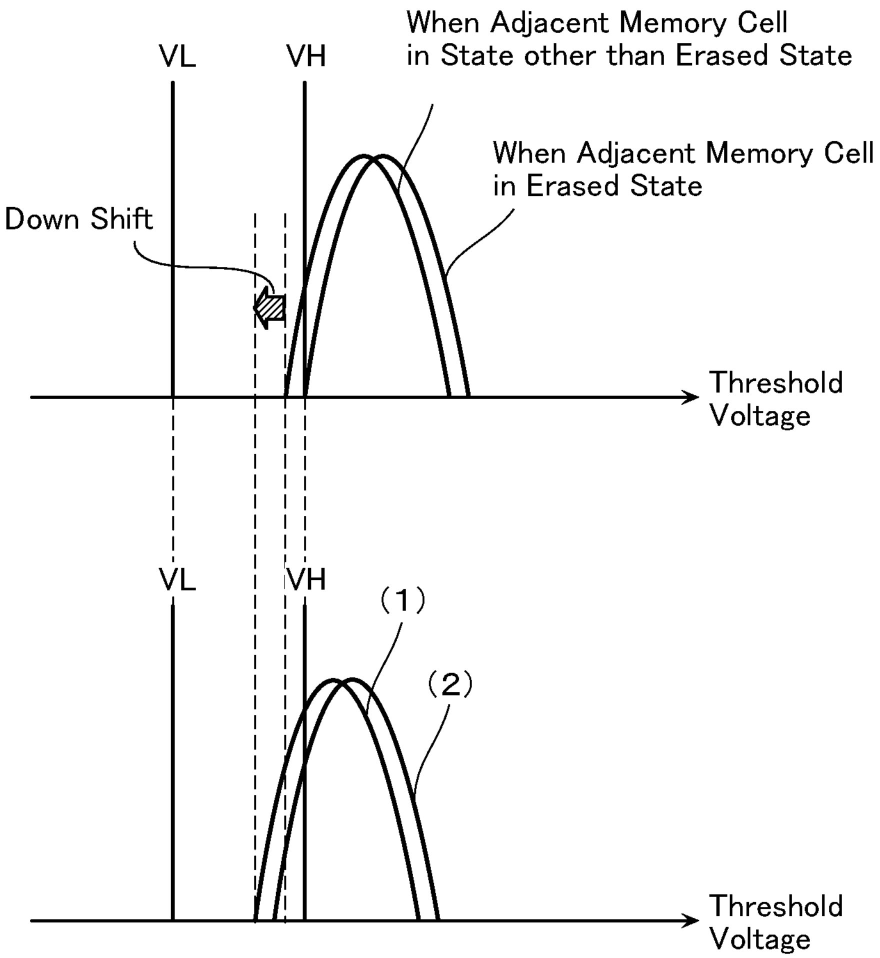
FIG. 25 is a view for explaining down-shifting of a threshold voltage after the write operation of the first embodiment.

However, in the write operation according to the first embodiment, when the adjacent memory cell MC (the word line WLn−1 of FIG. 24) adjacent to the write memory cell MC is in the erased state, the quick pass write program operation is not executed, rather, the normal program operation is executed. Hence, as described with reference to FIG. 22, the threshold distribution of the write memory cell MC in the lower portion of FIG. 22 has a larger threshold voltage than the threshold distribution of the write memory cell MC in the upper portion of FIG. 22. In this case, it becomes possible to suppress position of the threshold distribution of the write memory cell MC greatly deviating from a normal position of threshold distribution, even when down-shifting of the threshold distribution has occurred, as shown in FIG. 25.

Moreover, as described with reference to FIG. 14, in the write operation according to the first embodiment, processing of read of data of the adjacent memory cell MC (step S112) and adjustment of QPW data of the latch circuit TDL (step S113) are added. However, as described with reference to FIG. 21, the number of times of write loops is sometimes smaller in the case of executing the normal program operation than in the case of executing the quick pass write program operation. Hence, an increase in execution time of the write operation can be suppressed.

Second Embodiment

Next, a semiconductor memory device according to a second embodiment will be described with reference to FIGS. 26 to 28.

Figure 26:
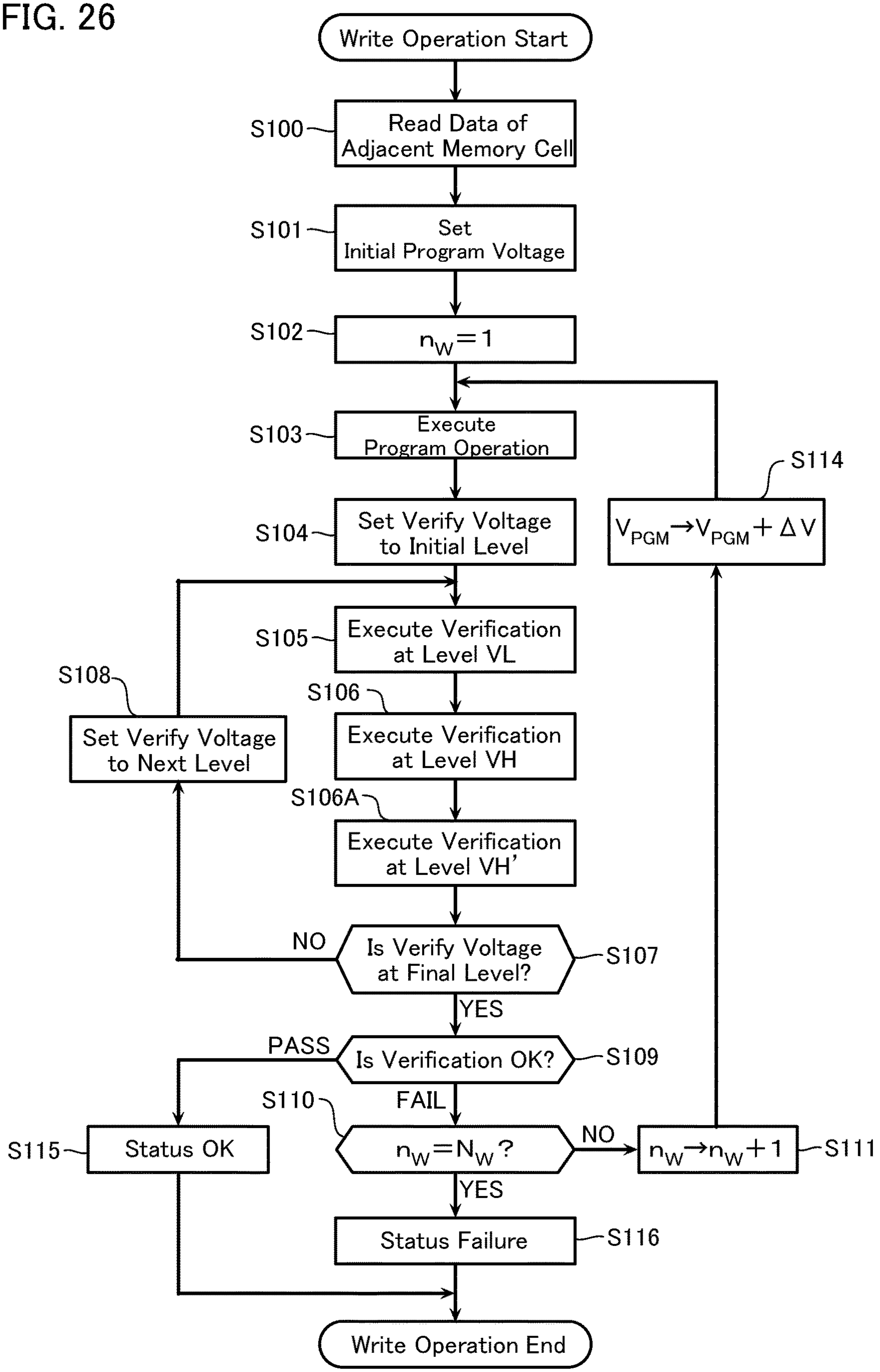
FIG. 26 is a schematic flowchart for explaining a write operation according to a second embodiment.
Figure 27:
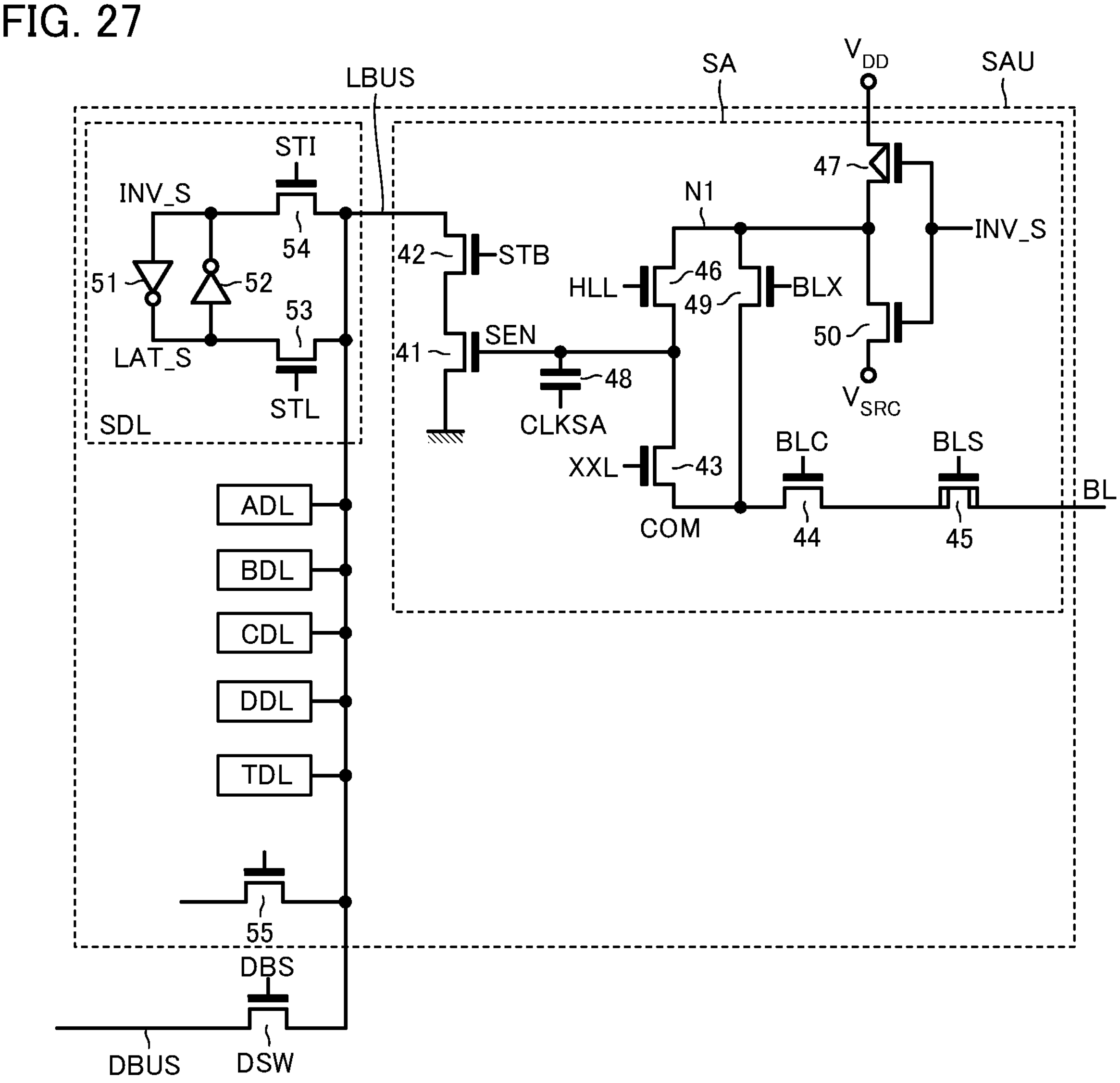
FIG. 27 is a schematic circuit diagram showing a configuration of a sense amplifier unit SAU according to the second embodiment.

FIG. 26 is a schematic flowchart for explaining a write operation according to the second embodiment. FIG. 27 is a schematic circuit diagram showing a configuration of a sense amplifier unit SAU according to the second embodiment. FIG. 28 is a view for explaining a program operation and a verify operation of the second embodiment.

In step S100 (FIG. 26), a read operation of data of the adjacent memory cell MC is executed. Step S100 is a processing similar to that of step S112 in FIG. 14. Note that data indicating whether the adjacent memory cell MC is in the erased state, or not, acquired in step S100 is stored in a latch circuit DDL shown in FIG. 27.

Moreover, steps S101 to S106 are similar to processing described with reference to FIG. 14. Hence, a description of this processing will be omitted.

In step S106A (FIG. 26), the verification is executed at a sense level VH' a little larger than the normal sense level VH.

In the write operation according to the second embodiment, when the adjacent memory cell MC adjacent to the write memory cell MC is in a state other than the erased state, two times of the verification, that is, a verify at the sense level VL a little lower than the normal sense level VH, and a verify at the normal sense level VH are executed with respect to a single level of verify voltage (for example, $V_{VFYA}$). That is, processing of steps S105, S106 is executed. On the other hand, when the adjacent memory cell MC adjacent to the write memory cell MC is in the erased state, three times of the verification, that is, a verify at the sense level VL a little lower than the normal sense level VH, a verify at the normal sense level VH, and a verify at the sense level VH' a little larger than the normal sense level VH are executed with respect to a single level of verify voltage (for example, $V_{VFYA}$). That is, processing of steps S105, S106, S106A is executed.

Figure 28:
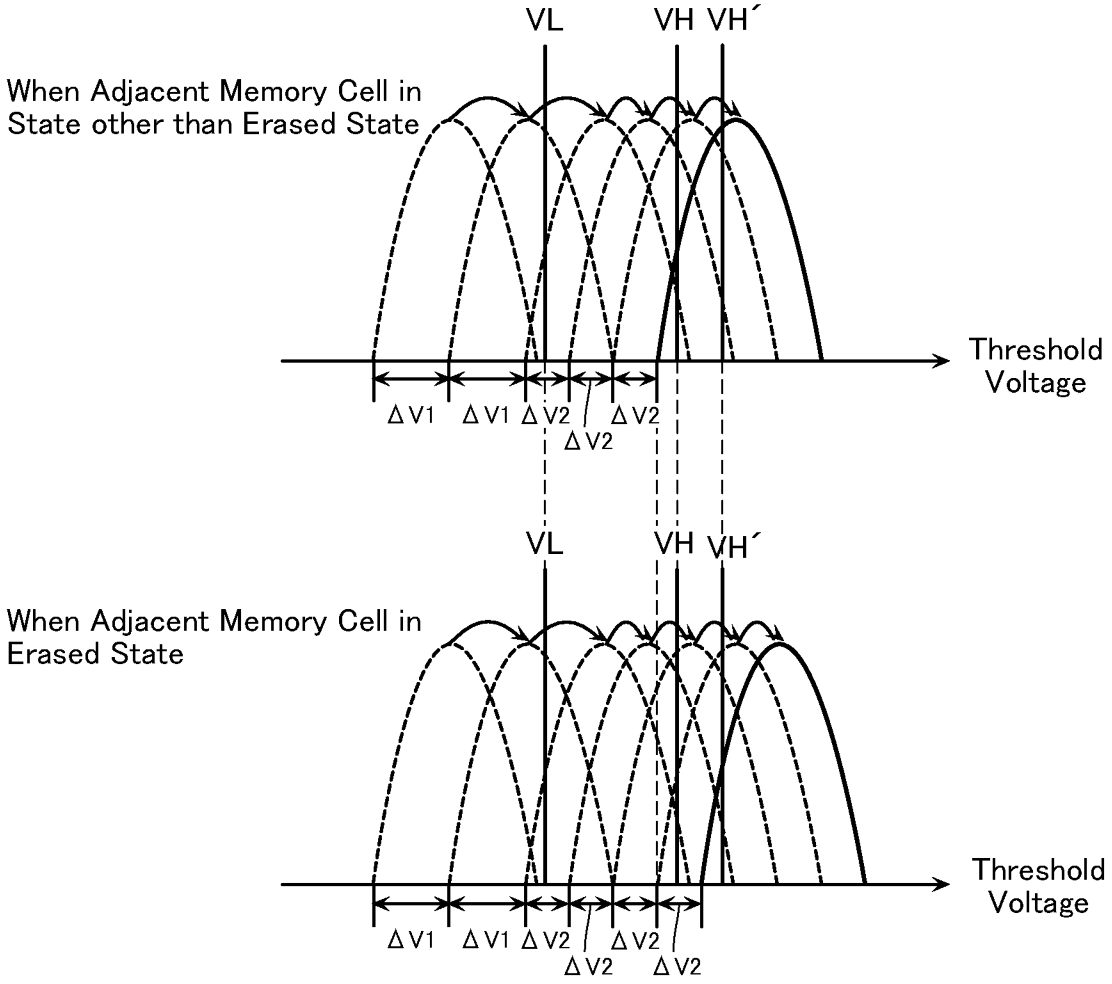
FIG. 28 is a view for explaining a program operation and a verify operation of the second embodiment.

As shown in an upper portion of FIG. 28, for example, when the adjacent memory cell MC adjacent to the write memory cell MC is in a state other than the erased state, the program operation and verify operation in the write loop are repeatedly executed until a greater part of the threshold distribution of the write memory cell MC (weak write memory cell MC) exceeds the sense level VH. On the other hand, as shown in a lower portion of FIG. 28, for example, when the adjacent memory cell MC adjacent to the write memory cell MC is in the erased state, the program operation and verify operation in the write loop are repeatedly executed until a greater part of the threshold distribution of the write memory cell MC (weak write memory cell MC) exceeds the sense level VH'.

The threshold distribution of the write memory cell MC in the lower portion of FIG. 28 has a larger threshold voltage than the threshold distribution of the write memory cell MC in the upper portion of FIG. 28.

Note that in the three times of verifies, the level of verify voltage applied to the selected word line $WL_S$ is the same. However, due to sense times in the three times of verifies differing, it appears as though the verify at the sense level VL a little lower than the normal sense level VH, the verify at the normal sense level VH, and the verify at the sense level VH' a little larger than the normal sense level VH have actually been performed, that is, there is a pseudo-execution of the three times of verifies.

Note that processing of steps S107 to S111, S114 to S116 in FIG. 26 is similar to processing described with reference to FIG. 14. Hence, a description of this processing will be omitted.

Due to this kind of configuration, it becomes possible to suppress position of the threshold distribution of the write memory cell MC greatly deviating from a normal position of threshold distribution, even when down-shifting of the threshold distribution has occurred.

Moreover, as described with reference to FIG. 28, the program operation and verify operation in the write loop are repeatedly executed until a greater part of the threshold distribution of the write memory cell MC exceeds the sense level VH', so the number of times of write loops will increase. However, the read operation of data of the adjacent memory cell MC (step S100) is only executed a single time in the write operation. Moreover, only a single sense level is added for each state, and there is no need to perform switching of the selected word line $WL_S$, and so on. Hence, an increase in execution time of the write operation is suppressed.

Third Embodiment

Next, a semiconductor memory device according to a third embodiment will be described with reference to FIG. 29.

Figure 29:
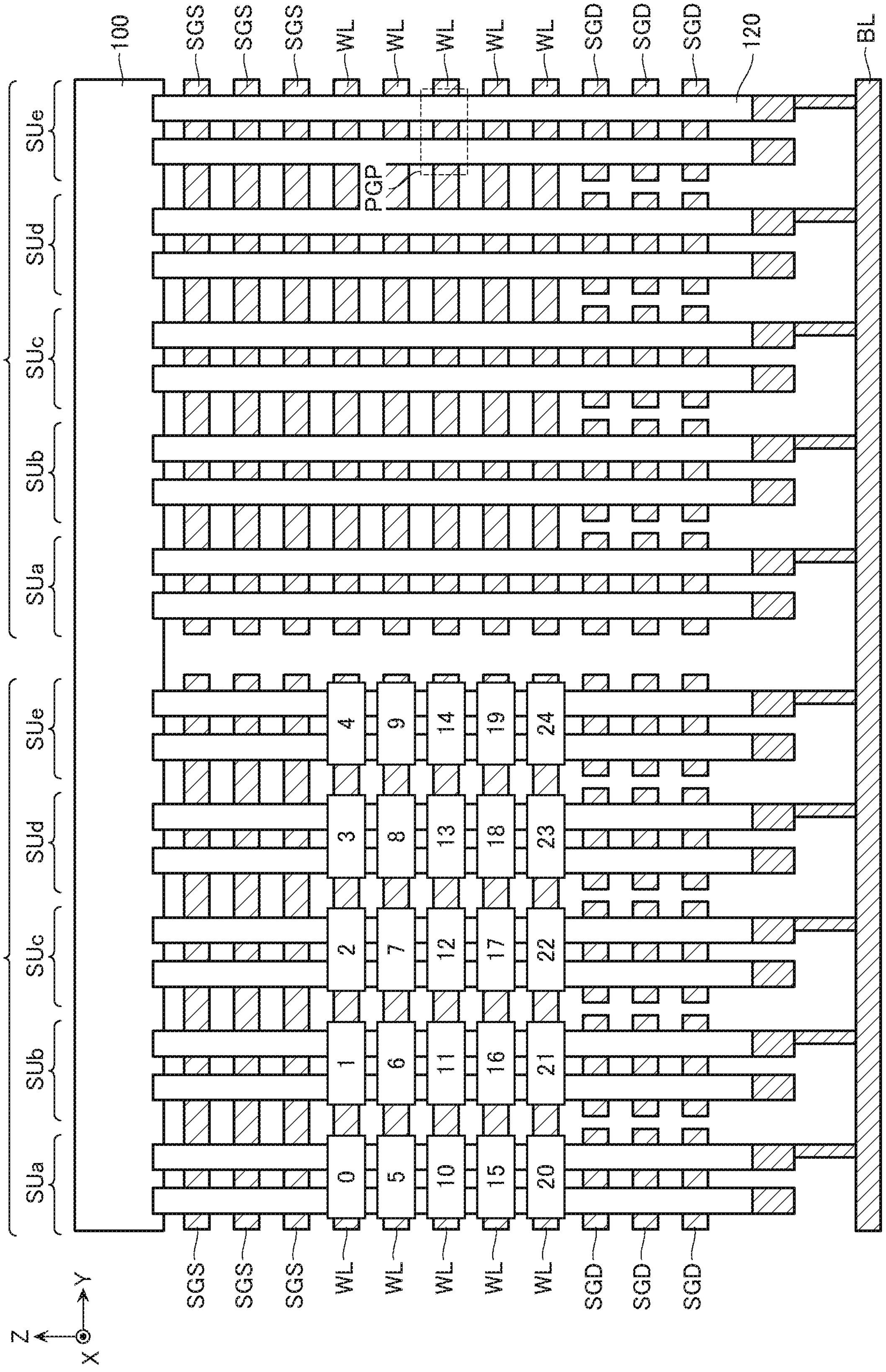
FIG. 29 is a schematic cross-sectional view for explaining order of execution of a write operation of a third embodiment.

FIG. 29 is a schematic cross-sectional view for explaining order of execution of a write operation of the third embodiment. The order of execution of the write operation shown in FIG. 29 has the write operation sequentially executed on the five page-portions PGP corresponding to the first word line WL counting from above, followed by the write operation being sequentially executed on the 20 page-portions PGP corresponding to the second to fifth word lines WL counting from above.

In this way, the order of execution of the write operation described with reference to FIG. 29 is vertically reversed from the order of execution of the write operation described with reference to FIG. 23. In this case, the adjacent memory cell MC is the memory cell MC adjacent on a positive side in the Z-direction to the write memory cell MC. A configuration other than the above-described configuration in FIG. 29 is similar to the configuration in FIG. 23, hence a duplicated description thereof will be omitted.

In this kind of configuration too, similarly to in the case described above in the first embodiment, it becomes possible to suppress position of the threshold distribution of the write memory cell MC greatly deviating from a normal position of threshold distribution, even when down-shifting of the threshold distribution has occurred. Moreover, an increase in execution time of the write operation can be suppressed.

Fourth Embodiment

Next, a semiconductor memory device according to a fourth embodiment will be described with reference to FIGS. 30 and 31.

Figure 30:
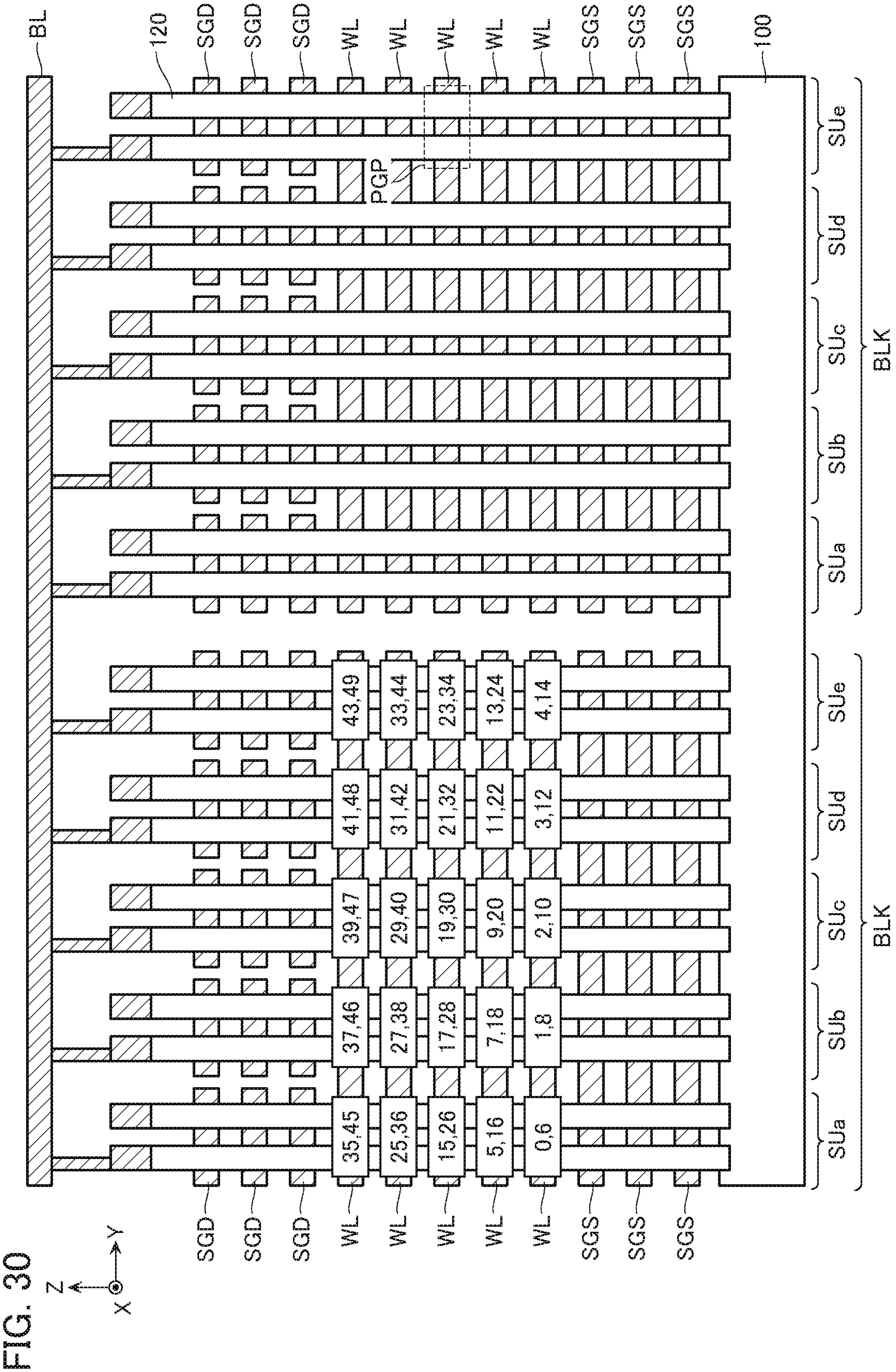
FIG. 30 is a schematic cross-sectional view for explaining order of execution of a write operation of a fourth embodiment.
Figure 31:
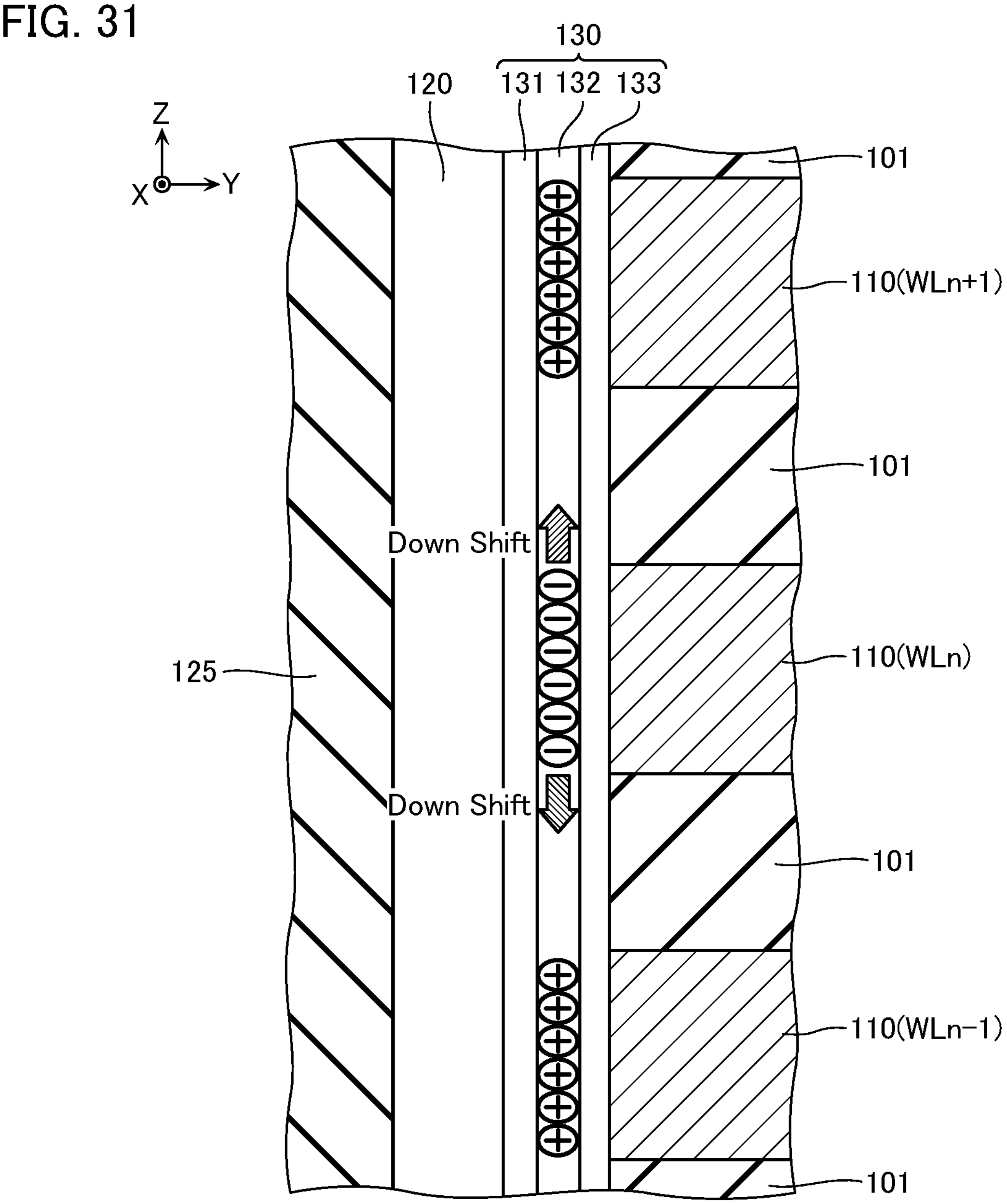
FIG. 31 is a schematic cross-sectional view showing states of carriers after the write operation of the fourth embodiment.

FIG. 30 is a schematic cross-sectional view for explaining order of execution of a write operation of the fourth embodiment. FIG. 31 is a schematic cross-sectional view showing states of carriers after the write operation of the fourth embodiment. The write operation of the fourth embodiment executes a write operation in the two stages of a foggy write operation and a fine write operation.

In the example of FIG. 30, first, the foggy write operation is sequentially executed on the five page-portions PGP corresponding to the first word line WL counting from below. Next, the foggy write operation is executed on the page-portion PGP corresponding to the second word line WL counting from below and string unit SUa. Next, the fine write operation is executed on the page-portion PGP corresponding to the first word line WL counting from below and string unit SUa. Next, the foggy write operation is executed on the page-portion PGP corresponding to the second word line WL counting from below and string unit SUb. Next, the fine write operation is executed on the page-portion PGP corresponding to the first word line WL counting from below and string unit SUb. Likewise, thereafter, the foggy write operation on the page-portions PGP corresponding to the second word line WL counting from below and fine write operation on the page-portions PGP corresponding to the first word line WL counting from below, are alternately executed.

Similarly, the foggy write operation on the page-portions PGP corresponding to the third to fifth word lines WL counting from below and fine write operation on the page-portions PGP corresponding to the second to fourth word lines WL counting from below, are alternately executed.

Next, the fine write operation is sequentially executed on the five page-portions PGP corresponding to the fifth word line WL counting from below.

When the write operation is executed in the order described with reference to FIG. 30, the adjacent memory cell MC adjacent to any of the memory cells MC corresponding to the second word line WL counting from below is in the erased state, for example, the threshold voltage of that one of the memory cells MC corresponding to the second word line WL counting from below will sometimes be down-shifted. Conceivably, the cause of this is that when, for example, three conductive layers 110 (word lines WLn−1, WLn, WLn+1) arranged in the Z-direction are supposed as in FIG. 31, apply of the program voltage $V_{PGM}$ to the conductive layer 110 (word line WLn) will cause electrons to shift to near vicinities of the conductive layer 110 (word line WLn−1) and conductive layer 110 (word line WLn+1), and so on.

However, in the write operation according to the fourth embodiment, when the adjacent memory cell MC (at least one of the word lines WLn−1, WLn+1 of FIG. 31) adjacent to the write memory cell MC is in the erased state, the quick pass write program operation is not executed, rather, the normal program operation is executed. Hence, as described with reference to FIGS. 22 and 28, the threshold distribution of the write memory cell MC in the lower portions of FIGS. 22 and 28 has a larger threshold voltage than the threshold distribution of the write memory cell MC in the upper portions of FIGS. 22 and 28. In this case, it becomes possible to suppress position of the threshold distribution of the write memory cell MC greatly deviating from a normal position of threshold distribution, even when down-shifting of the threshold distribution has occurred, as shown in FIG. 25.

Other Embodiments

That concludes description of the semiconductor memory devices according to the first to fourth embodiments. However, such configurations are merely exemplifications, and specific configurations, methods, and so on, may be appropriately adjusted.

For example, in the write operation according to the first embodiment, the read operation of data of the adjacent memory cell MC (step S112) is executed in the write loop (FIG. 14). However, the read operation of data of the adjacent memory cell MC may be executed outside the write loop (refer to step S100 of FIG. 26), as in the write operation according to the second embodiment. In this case, similarly to in the sense amplifier unit SAU of FIG. 27, the latch circuit DDL is provided, and data indicating whether the adjacent memory cell MC is in the erased state, or not, acquired in the read operation is stored in that latch circuit DDL.

Moreover, for example, in the write operation according to the second embodiment, the read operation of data of the adjacent memory cell MC (step S100) is executed outside the write loop (FIG. 26). However, the read operation of data of the adjacent memory cell MC may be executed within the write loop (refer to step S112 of FIG. 14), as in the write operation according to the first embodiment. In this case, the sense amplifier unit SAU of FIG. 27 need not be provided with the latch circuit DDL.

Moreover, in the write operations according to the first to fourth embodiments, the write memory cell MC undergoes execution of the normal program operation instead of the quick pass write program operation when the adjacent memory cell MC is in the erased state. However, the write memory cell MC may undergo execution of the normal program operation instead of the quick pass write program operation when the adjacent memory cell MC is in a Low-state (for example, a state of the Er state, A state, B state, C state, D state, E state, or F state).

Moreover, in the semiconductor memory devices according to the first to fourth embodiments, there is a configuration comprising the chip $C_M$ on the memory cell array MCA side and chip $C_P$ on the peripheral circuit PC side. Moreover, the upper end of the semiconductor layer 120 is connected to the conductive layer 100. However, such a configuration is merely an exemplification. The methods of the above-described kinds of write operations, and so on, are applicable to semiconductor memory devices having other structures, too.

[Others]

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of controlling a semiconductor memory device, the semiconductor memory device comprising:
- a substrate;
- a plurality of conductive layers arranged in a first direction intersecting a surface of the substrate;
- a plurality of semiconductor layers extending in the first direction and facing the plurality of conductive layers;
- a plurality of electric charge accumulating layers provided between the plurality of conductive layers and the plurality of semiconductor layers;
- a plurality of bit lines electrically connected to one end portion in the first direction of the plurality of semiconductor layers; and
- a control circuit electrically connected to the plurality of conductive layers and the plurality of bit lines, wherein
- the plurality of conductive layers include a first conductive layer and a second conductive layer adjacent in the first direction to the first conductive layer,
- the control circuit is configured capable of executing a write operation,
- the write operation includes a plurality of write loops,
- the plurality of write loops each include a program operation that applies the first conductive layer with a program voltage, and applies the second conductive layer with a write pass voltage smaller than the program voltage,
- the program voltage increases an offset voltage at a time along with increase in the number of times of executions of the write loop,
- the write operation includes a state judging operation that judges whether a plurality of memory cells corresponding to the plurality of semiconductor layers and the second conductive layer are controlled to a Low-state, or not, and
- in the program operation in at least a part of the plurality of write loops,
- a first bit line voltage is applied to first bit lines among the plurality of bit lines corresponding to the memory cells is judged to be the Low-state in the state judging operation, and
- a second bit line voltage larger than the first bit line voltage is applied to second bit lines among the plurality of bit lines corresponding to memory cells judged not to be the Low-state in the state judging operation.

2. The semiconductor memory device according to claim 1, wherein
- the state judging operation judges whether the memory cell is controlled to an erased state, or not.

3. The method of controlling a semiconductor memory device according to claim 1, wherein
- the state judging operation is included in the write loop.

4. The method of controlling a semiconductor memory device according to claim 1, wherein
- in the state judging operation,
- the first conductive layer is applied with a read pass voltage smaller than the program voltage, and
- the second conductive layer is applied with a read voltage smaller than the read pass voltage.

5. The method of controlling a semiconductor memory device according to claim 1, wherein
- the plurality of write loops each include a verify operation that applies the first conductive layer with a verify voltage and applies the second conductive layer with a read pass voltage smaller than the program voltage, and
- the verify operation executes verification at a first sense level and executes verification at a second sense level larger than the first sense level.

6. The method of controlling a semiconductor memory device according to claim 5, wherein
- the first bit line voltage is applied to first bit lines corresponding to verify PASS in the result of verification at the first sense level, and
- the second bit line voltage is applied to second bit lines corresponding to a verify PASS in the result of verification at the first sense level.

7. The method of controlling a semiconductor memory device according to claim 1, the semiconductor memory device further comprising a plurality of first latch circuits electrically connected to the plurality of bit lines, wherein the plurality of first latch circuits latch data indicating whether the second bit line voltage is applied to corresponding bit lines, or not.

8. The method of controlling a semiconductor memory device according to claim 7, wherein the data latched by the plurality of first latch circuits is adjusted according to a result of the state judging operation.

9. A method of controlling a semiconductor memory device, the semiconductor memory device comprising:

a substrate;

a plurality of conductive layers arranged in a first direction intersecting a surface of the substrate;

a plurality of semiconductor layers extending in the first direction and facing the plurality of conductive layers;

a plurality of electric charge accumulating layers provided between the plurality of conductive layers and the plurality of semiconductor layers;

a plurality of bit lines electrically connected to one end portion in the first direction of the plurality of semiconductor layers; and a control circuit electrically connected to the plurality of conductive layers and the plurality of bit lines, wherein the plurality of conductive layers include a first conductive layer and a second conductive layer adjacent in the first direction to the first conductive layer, the control circuit is configured capable of executing a write operation, the write operation includes a plurality of write loops, the plurality of write loops each include:

a program operation that applies the first conductive layer with a program voltage, and applies the second conductive layer with a write pass voltage smaller than the program voltage; and a verify operation that applies the first conductive layer with a verify voltage and applies the second conductive layer with a read pass voltage smaller than the program voltage, the program voltage increases an offset voltage at a time along with increase in the number of times of executions of the write loop, the write operation includes a state judging operation that judges whether a plurality of memory cells corresponding to the plurality of semiconductor layers and the second conductive layer are controlled to a Low-state, or not, the verify operation executes verification at a first sense level, executes verification at a second sense level larger than the first sense level, and executes verification at a third sense level larger than the second sense level, and in the program operation in at least a part of the plurality of write loops, a first bit line voltage is applied to first bit lines among the plurality of bit lines corresponding to verify FAIL in a result of verification at the first sense level, a second bit line voltage larger than the first bit line voltage is applied to second bit lines among the plurality of bit lines corresponding to verify PASS in the result of verification at the first sense level, and corresponding to verify FAIL in the result of verification at the second sense level, and corresponding to memory cells judged not to be the Low-state in the state judging operation, and the second bit line voltage is applied to third bit lines among the plurality of bit lines corresponding to verify PASS in the result of verification at the first sense level, and corresponding to verify FAIL in the result of verification at the third sense level, and corresponding to memory cells judged to be the Low-state in the state judging operation.

10. The method of controlling a semiconductor memory device according to claim 9, wherein the state judging operation judges whether the memory cell is controlled to an erased state, or not.

11. The method of controlling a semiconductor memory device according to claim 9, wherein the state judging operation is not included in the write loop.

12. The method of controlling a semiconductor memory device according to claim 9, further comprising the semiconductor memory device further comprising a plurality of first latch circuits and a plurality of second latch circuits electrically connected to the plurality of bit lines, wherein the plurality of first latch circuits latch data indicating whether the second bit line voltage is applied to corresponding bit lines, or not, and the plurality of second latch circuits latch a result of the status judging operation.

* * * * *